(12) United States Patent
Seo et al.

(10) Patent No.: US 12,302,705 B2
(45) Date of Patent: May 13, 2025

(54) DISPLAY DEVICE AND METHOD OF FABRICATING THE SAME

(71) Applicant: Samsung Display Co., LTD., Yongin-si (KR)

(72) Inventors: Jong Oh Seo, Seoul (KR); Jang Hyun Kim, Hwaseong-si (KR); Byung Soo So, Yongin-si (KR); Jae Woo Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 332 days.

(21) Appl. No.: 17/751,416

(22) Filed: May 23, 2022

(65) Prior Publication Data

US 2023/0106004 A1 Apr. 6, 2023

(30) Foreign Application Priority Data

Oct. 6, 2021 (KR) .......................... 10-2021-0132699

(51) Int. Cl.
| | |
|---|---|
| *H10K 59/121* | (2023.01) |
| *H01L 27/12* | (2006.01) |
| *H10K 59/12* | (2023.01) |
| *H10K 71/00* | (2023.01) |
| *H10K 77/10* | (2023.01) |
| *H10K 102/00* | (2023.01) |

(52) U.S. Cl.
CPC ......... *H10K 59/1213* (2023.02); *H10K 71/00* (2023.02); *H01L 27/1222* (2013.01); *H10K 59/1201* (2023.02); *H10K 77/111* (2023.02); *H10K 2102/311* (2023.02)

(58) Field of Classification Search
CPC ............... H10K 59/1213; H10K 71/00; H10K 27/1222; H10K 59/1201; H10K 77/111; H10K 2102/311; H10K 27/127; H10K 29/78675; H10K 29/78696; H10K 59/123
See application file for complete search history.

(56) References Cited

U.S. PATENT DOCUMENTS

| | | | |
|---|---|---|---|
| 11,764,232 B2 * | 9/2023 | Liu | H01L 27/1222 345/215 |
| 2005/0282317 A1 * | 12/2005 | Ikeda | H01L 29/78645 438/149 |
| 2011/0146759 A1 * | 6/2011 | Lee | H01L 31/1864 257/E31.113 |

FOREIGN PATENT DOCUMENTS

| | | |
|---|---|---|
| KR | 10-0540885 B1 | 1/2006 |
| KR | 10-2020-0060626 A | 6/2020 |
| KR | 10-2020-0121941 A | 10/2020 |

OTHER PUBLICATIONS

Byeong-Koo Kim et al., "Recoverable residual image induced by hysteresis of thin film transistors in active matrix organic light emitting diode displays", Japanese Journal of Applied Physics, Mar. 19, 2004, pp. L482-L485, vol. 43, No. 4A, The Japan Society of Applied Physics.

* cited by examiner

*Primary Examiner* — J. E. Schoenholtz
(74) *Attorney, Agent, or Firm* — Womble Bond Dickinson (US) LLP

(57) ABSTRACT

A display device includes: a substrate; a semiconductor layer on the substrate, and including a channel of at least one transistor; a first insulating layer on the semiconductor layer; and a gate electrode on the first insulating layer. The semiconductor layer includes polycrystalline silicon, and the channel includes: a first region containing a first impurity; and a second region containing a second impurity different from the first impurity.

19 Claims, 28 Drawing Sheets

DISPLAY DEVICE AND METHOD OF FABRICATING THE SAME

CROSS-REFERENCE TO RELATED APPLICATION

This application claims priority to and the benefit of Korean Patent Application No. 10-2021-0132699, filed on Oct. 6, 2021, in the Korean Intellectual Property Office, the entire disclosure of which is incorporated by reference herein.

BACKGROUND

1. Field

Aspects of embodiments of the present disclosure relate to a display device, and a method of fabricating the same.

2. Description of the Related Art

As information-oriented society evolves, various demands for display devices are ever increasing. For example, display devices are being employed by a variety of electronic devices, such as smart phones, digital cameras, laptop computers, navigation devices, and smart televisions.

Display devices may include flat panel display devices, such as a liquid-crystal display device, a field emission display device, and a light-emitting display device. Light-emitting display devices include an organic light-emitting display device including an organic light-emitting element, an inorganic light-emitting display device including an inorganic light-emitting element such as an inorganic semiconductor, and a micro-light-emitting display device including an ultra-small light-emitting element.

From among the light-emitting display devices, the organic light-emitting display device displays images by using an organic light-emitting element that emits light as electrons and holes recombined. Such an organic light-emitting display device includes a plurality of transistors for providing a driving current to the organic light-emitting element. Each of the plurality of transistors may include a channel region, and the channel region of each transistor may be doped.

The above information disclosed in this Background section is for enhancement of understanding of the background of the present disclosure, and therefore, it may contain information that does not constitute prior art.

SUMMARY

One or more embodiments of the present disclosure are directed to a display device having improved transistor characteristics, while improving issues related to hysteresis and image retention, and a method of fabricating the same.

However, the aspects and features of the present disclosure are not limited to those described above, and other aspects and features of the present disclosure will be apparent to those having ordinary skill in the art from the following description.

According to one or more embodiments of the present disclosure, a display device includes: a substrate; a semiconductor layer on the substrate, and including a channel of at least one transistor; a first insulating layer on the semiconductor layer; and a gate electrode on the first insulating layer. The semiconductor layer includes polycrystalline silicon, and the channel includes: a first region containing a first impurity; and a second region containing a second impurity different from the first impurity.

In an embodiment, the second region may be located on the first region, and may overlap the first region.

In an embodiment, an upper surface of the first region may be in contact with a lower surface of the second region.

In an embodiment, the first impurity may include a Group V element, and the second impurity may include a Group III element.

In an embodiment, the first impurity may include phosphorus, and the second impurity may include boron.

In an embodiment, a thickness of the first region may range from 100 Å to 400 Å, and a thickness of the second region may range from 70 Å to 370 Å.

In an embodiment, the display device may further include a third region between the first region and the second region, the third region including the first impurity and the second impurity.

In an embodiment, the second impurity in the third region may have a concentration gradient that gradually decreases toward the first region.

In an embodiment, the at least one transistor may further include a first electrode and a second electrode connected to the semiconductor layer.

In an embodiment, the display device may further include a light-emitting element on the at least one transistor, the light-emitting element including: an anode electrode electrically connected to the second electrode; a light emitting layer on the anode electrode; and a cathode electrode on the light emitting layer.

According to one or more embodiments of the present disclosure, a method of fabricating a display device, includes: forming a first amorphous silicon layer on a substrate; forming a first region by doping at least a part of the first amorphous silicon layer with a first impurity; forming a second amorphous silicon layer on the first amorphous silicon layer; forming a polycrystalline silicon layer by crystallizing the first amorphous silicon layer and the second amorphous silicon layer; forming a second region on the first region of the polycrystalline silicon layer by doping the polycrystalline silicon layer with a second impurity different from the first impurity; and forming a semiconductor layer by patterning the polycrystalline silicon layer.

In an embodiment, the doping of the part of the first amorphous silicon layer with the first impurity may include doping the first impurity with an acceleration voltage of 10 keV to 40 keV.

In an embodiment, the doping of the first impurity may include doping the first impurity at a dose of $1.0E11$ $cm^{-2}$ to $1.0E13$ $cm^{-2}$.

In an embodiment, the first amorphous silicon layer may be formed to have a thickness of 100 Å to 400 Å.

In an embodiment, the doping of the polycrystalline silicon layer with the second impurity may include doping the second impurity with an acceleration voltage of 0.1 keV to 5 keV.

In an embodiment, the doping of the second impurity may include doping the second impurity at a dose of $1.0E11$ $cm^{-2}$ to $1.0E13$ $cm^{-2}$.

In an embodiment, the second amorphous silicon layer may be formed to have a thickness of 70 Å to 370 Å.

In an embodiment, the first impurity may include phosphorus, and the second impurity may include boron.

In an embodiment, the first region and the second region may overlap with each other, and an upper surface of the first region and a lower surface of the second region may be in contact with each other.

In an embodiment, the method may further include: forming a sacrificial layer on the polycrystalline silicon layer between the forming of the polysilicon silicon layer and the forming of the second region by the doping of the second impurity; and removing the sacrificial layer before the forming of the semiconductor layer.

According to one or more embodiments of the present disclosure, Group III element impurity may be located at a surface of a channel of transistors, and Group V element impurity may be located at a bottom of the channel, so that issues related to hysteresis and image retention may be improved.

In addition, according to one or more embodiments of the present disclosure, it may be possible to improve characteristics of a switching transistor.

However, the aspects and features of the present disclosure are not limited to those described above, and other aspects and features of the present disclosure will be apparent to those having ordinary skill in the art from the following detailed description with reference to the figures.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
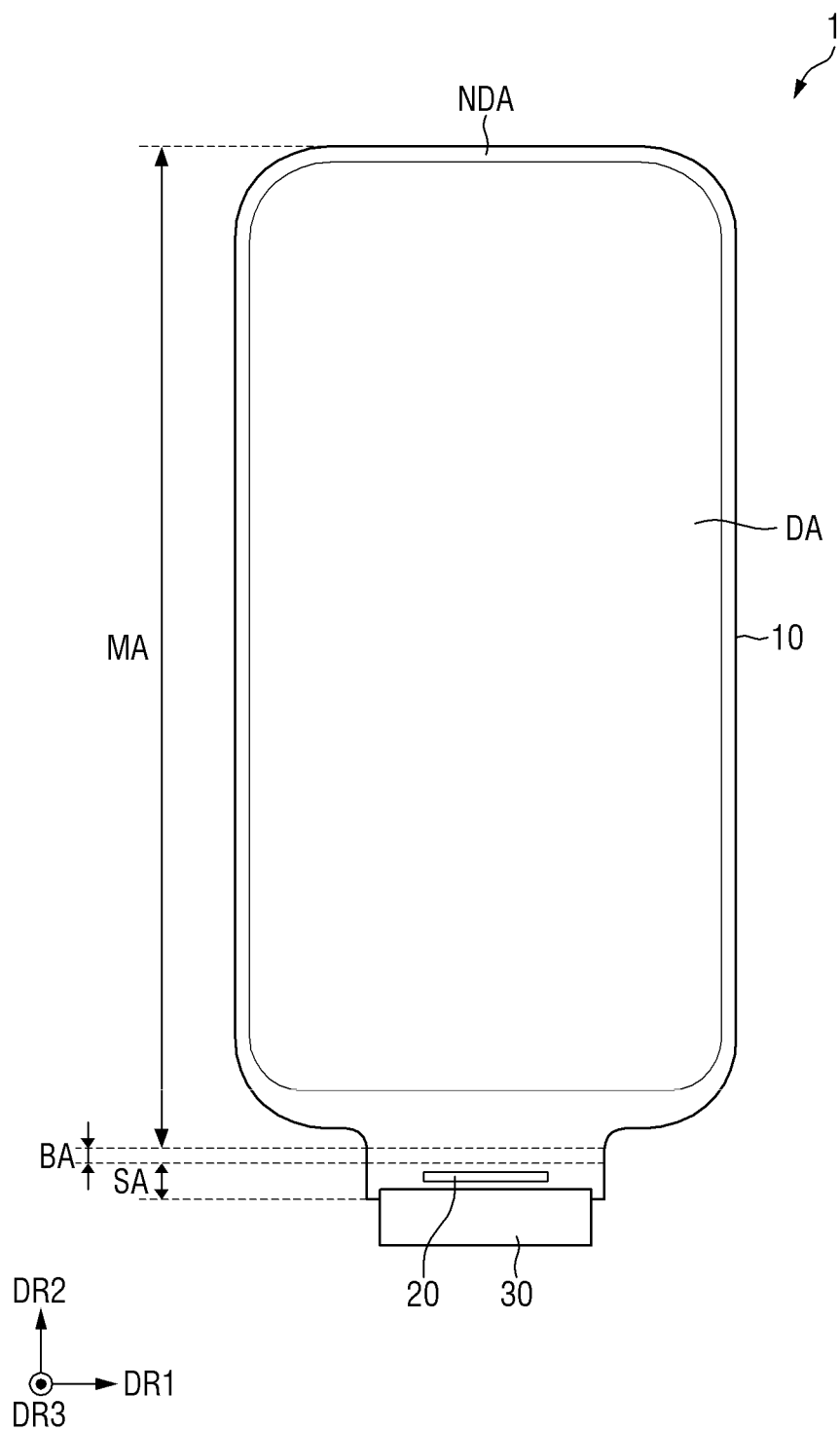
FIG. 1 is a plan view of a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to"

another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
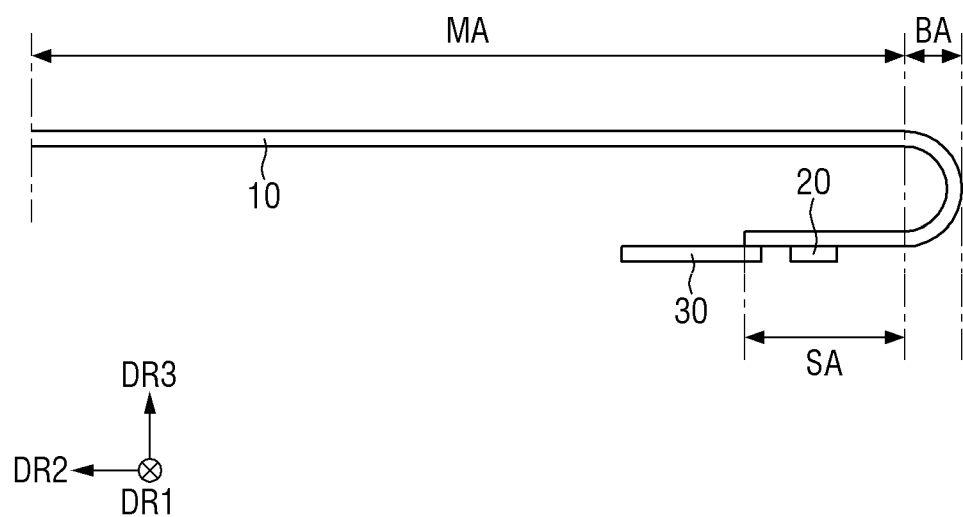
FIG. 2 is a side view of the display device of FIG. 1.

FIG. 1 is a plan view of a display device according to an embodiment of the present disclosure. FIG. 2 is a side view of the display device of FIG. 1. FIG. 2 shows a shape of a side of a display device when bent in a thickness direction (e.g., a third direction DR3).

A display device 1 displays moving images and/or still images. The display device 1 may be used as a display screen of various suitable portable electronic devices, for example, such as a mobile phone, a smart phone, a tablet PC, a smart watch, a watch phone, a mobile communications terminal, an electronic notebook, an electronic book, a portable multimedia player (PMP), a navigation device, and a ultra mobile PC (UMPC), as well as the display screen of various suitable products, for example, such as a television, a notebook, a monitor, a billboard, and an Internet of Things (IoT) device.

According to an embodiment of the present disclosure, the display device 1 may have a rectangular or substantially rectangular shape in a plan view (e.g., when viewed from the top). The display device 1 may have a rectangular shape with rounded corners in a plan view (e.g., when viewed from the top). However, the present disclosure is not limited thereto. For example, the display device 1 may have a rectangular shape with corners having a right angle in a plan view (e.g., when viewed from the top)).

In the drawings, a first direction DR1 denotes the horizontal direction of a display device 1 in a plan view, and a second direction DR2 denotes the vertical direction of the display device 1 in a plan view. In addition, the third direction DR3 may refer to the thickness direction of the display device 1. The first and second directions DR1 and DR2 cross each other. For example, the first direction DR1 may be perpendicular to or substantially perpendicular to the second direction DR2. The third direction crosses each of the first and second directions DR1 and DR2. For example, the third direction DR3 may be orthogonal to or substantially orthogonal to a plane defined by the first direction DR1 and the second direction DR2, and may be perpendicular to or substantially perpendicular to each of the first and second directions DR1 and DR2. However, it should be understood that the above described directions are relative directions, and thus, the present disclosure is not limited to the above described directions.

As used herein, the terms "top", "upper surface", and "upper side" in the third direction DR3 refer to a display side of a display panel 10, and the terms "bottom", "lower surface", and "lower side" refer to an opposite side of the display panel 10 from the display side, unless otherwise described.

Referring to FIGS. 1 and 2, the display device 1 may include the display panel 10. The display panel 10 may include a flexible substrate including a flexible polymer material, for example, such as polyimide. Accordingly, the display panel 10 may be curved, bent, folded, and/or rolled.

The display panel 10 may be an organic light-emitting display panel. For convenience of description, the organic light-emitting display panel will be described in more detail as an example of the display panel 10. However, the present disclosure is not limited thereto, and other suitable kinds of display panels may be applied, for example, such as a liquid-crystal display panel, a quantum-dot organic light-emitting display panel, a quantum-dot liquid-crystal display panel, a quantum-nano light-emitting display panel, and a micro LED panel.

The display panel 10 may include a display area DA where images are displayed, and a non-display area NDA where no image is displayed. The display panel 10 may include the display area DA and the non-display area NDA in a plan view (e.g., when viewed from the top). The non-display area NDA may surround (e.g., around a periphery of) the display area DA. The non-display area NDA may form a bezel or a bezel area.

The display area DA may have a rectangular shape with rounded corners or corners having the right angle in a plan view (e.g., when viewed from the top). However, the present disclosure is not limited thereto. For example, the display area DA may have any suitable shape, for example, such as a circle, an ellipse, or another suitable polygon shape.

The display area DA may include a plurality of pixels. The pixels may be arranged in a matrix form. Each of the pixels may include a light emitting layer, and a circuit layer for controlling an amount of light emitted from the light emitting layer. The circuit layer may include lines (e.g., signal lines, power lines, and/or the like), electrodes, and at least one transistor. The light emitting layer may include an organic light-emitting material. The light emitting layer may be encapsulated by an encapsulation layer. The configuration of the pixels will be described in more detail below.

The non-display area NDA may surround (e.g., around a periphery of) all of the sides of the display area DA, and may form edges of the display area DA. However, the present disclosure is not limited thereto, and the non-display area NDA may partially surround (e.g., around a periphery of) the display area DA or may be omitted.

The display panel 10 may include a main area MA, and a bending area BA connected to one side of the main area MA in the second direction DR2. The display panel 10 may further include a subsidiary area SA connected to one side of the bending area BA in the second direction DR2. The subsidiary area SA may overlap with the main area MA when the subsidiary area SA is bent in the thickness direction.

The display area DA may be located in the main area MA. The non-display area NDA may be located at a peripheral edge of the display area DA in the main area MA.

The main area MA may have a shape that is the same or substantially the same as (or similar to) the outer shape of the display device 1 in a plan view (e.g., when viewed from the top). The main area MA may be a flat or substantially flat area that is located in one plane. However, the present disclosure is not limited thereto. For example, at least one of the edges (e.g., the outer edges) of the main area MA, except for the edge (e.g., a side) thereof connected to the bending area BA, may be curved to form a curved surface or may be bent at a right angle.

When at least one of the edges of the main area MA (e.g., except for the edge (e.g., side) thereof connected to the bending area BA) is curved or bent, the display area DA may also be disposed at the edge. However, the present disclosure is not limited thereto. For example, the non-display area NDA that does not display an image may be disposed at (e.g., in or on) the curved or bent edge, or the display area DA and the non-display area NDA may be disposed together.

The non-display area NDA of the main area MA may extend from the outer border of the display area DA to the edge of the display panel 10. Signal lines for applying signals to the display area DA or driving circuits may be disposed at (e.g., in or on) the non-display area NDA of the main area MA.

The bending area BA may be connected to the main area MA at one shorter side of the main area MA. A width of the bending area BA (e.g., the width in the first direction DR1) may be smaller than a width of the main area MA (e.g., the width of the shorter side of the main area MA). Portions where the main area MR meets the bending area BR may have an L-cut shape (e.g., may be cut in an L-shape) in order to reduce a width of the bezel.

The display panel 10 may be bent toward the opposite side of the display surface at (e.g., in or on) the bending area BA to have a curvature. As the display panel 10 is bent at the bending area BA, a surface of the display panel 10 may be reversed. In more detail, the surface of the display panel 10 facing upward may be bent, such that the surface faces outward at the bending area BA and faces downward beneath the display panel 10.

The subsidiary area SA may extend from the bending area BA. The subsidiary area SA may extend in a direction that is parallel to or substantially parallel to the main area MA from an end of the bending area BA. The subsidiary area SA may overlap with the main area MA in the thickness direction of the display panel 10. The subsidiary area SA may overlap with the non-display area NDA at the edge of the main area MA, and may also overlap with the display area DA of the main area MA. A width of the subsidiary area SA may be equal to or substantially equal to the width of the bending area BA, but the present disclosure is not limited thereto.

A pad area may be located at (e.g., in or on) the subsidiary area SA of the display panel 10. An external device may be mounted on (or attached to) the pad area. Examples of the external device include a driving chip 20, and a driving board 30 implemented as a flexible printed circuit board or a rigid printed circuit board. Other line connection films, connectors, and/or the like may be mounted on the pad area as well.

More than one external device may be mounted on the subsidiary area SA. For example, as shown in FIGS. 1 and 2, the driving chip 20 may be disposed at (e.g., in or on) the subsidiary area SA of the display panel 10, and the driving board 30 may be attached to an end of the subsidiary area SA. In this case, the display device 10 may include a pad area connected to the driving chip 20, as well as a pad area connected to the driving board 30. According to another embodiment, a driving chip may be mounted on a film, and the film may be attached to the subsidiary area SA of the display panel 10.

The driving chip 20 is mounted on a surface of the display panel 10 which is the display surface. As the bending area BA is bent and accordingly, the surface is reversed as described above, the driving chip 20 may be mounted on the surface of the display panel 10 facing downward in the thickness direction, such that the upper surface of the driving chip 20 may face downward. The driving chip 20 may be attached to the display panel 10 by an anisotropic conductive film or by ultrasonic bonding. The driving chip 20 may include an integrated circuit for driving the display panel 10.

Figure 3:
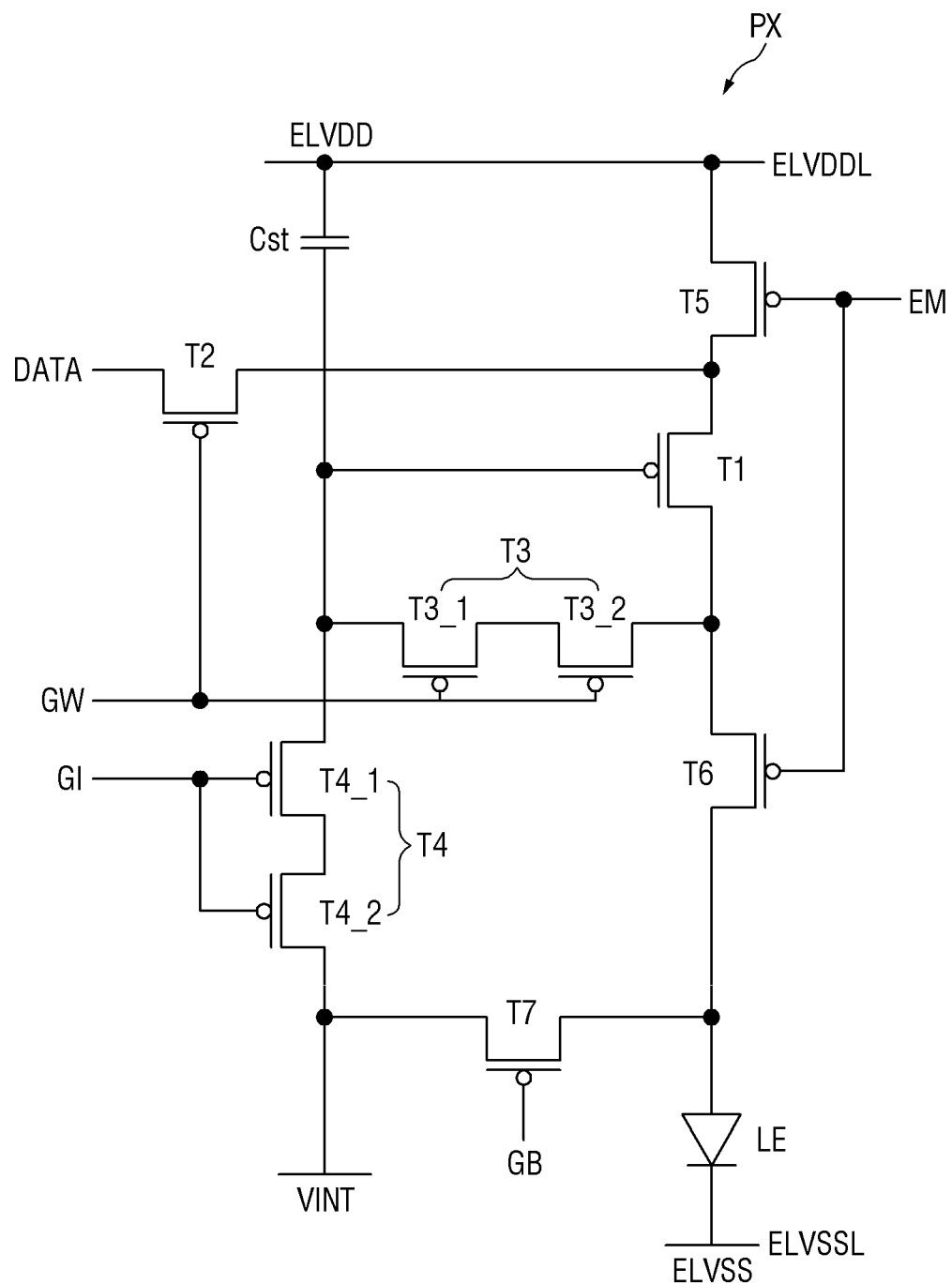
FIG. 3 is a circuit diagram showing a pixel according to an embodiment of the present disclosure.

FIG. 3 is a circuit diagram showing a pixel according to an embodiment of the present disclosure.

Referring to FIG. 3, the circuit of the pixel PX includes a plurality of transistors T1 to T7, a capacitor Cst, a light-emitting element LE, and the like. A data signal DATA, a first scan signal GW, a second scan signal GI, a third scan signal GB, an emission control signal EM, a first supply voltage ELVDD, a second supply voltage ELVSS, and an initialization voltage VINT may be applied to the circuit of the pixel PX.

The light-emitting element LE may be, for example, an organic light-emitting diode including a first electrode (e.g., an anode electrode), a light emitting layer, and a second electrode (e.g., a cathode electrode), but the present disclosure is not limited thereto.

The plurality of transistors may include first to seventh transistors T1 to T7. Each of the transistors T1 to T7 includes a channel, a gate electrode, a first electrode (e.g., a first source/drain electrode), and a second electrode (e.g., a second source/drain electrode). One of the first electrode and the second electrode of each of the transistors T1 to T7 may be a source electrode, and the other of the first electrode and the second electrode may be a drain electrode.

Each of the transistors T1 to T7 may be a thin-film transistor. The first transistor T1 may operate as a driving transistor, and the second to seventh transistors T2 to T7 may operate as switching transistors.

The channel of the first transistor T1 as the driving transistor and the channels of the second to seventh transistors T2 form T7 as the switching transistors may be doped with different materials from each other. In more detail, the channel of the first transistor T1 as the driving transistor and the channels of the second to seventh transistors T2 to T7 as the switching transistors may be doped with different materials from each other, and the channel of the first transistor T1 may be further doped with a material that is not doped into the channels of the second to seventh transistors T2 to T7. Accordingly, device characteristics of the driving transistor and the switching transistors may be improved. This will be described in more detail below.

Each of the transistors T1 to T7 may be one of a PMOS transistor or an NMOS transistor. In an embodiment, the first transistor T1 as a driving transistor, the second transistor T2 as a data transfer transistor, the third transistor T3 as a compensating transistor, the fourth transistor as a first initializing transistor, the fifth transistor T5 as a first emission control transistor, the sixth transistor T6 as a second emission control transistor, and the seventh transistor T7 as a second initializing transistor may all be PMOS transistors.

However, the present disclosure is not limited thereto. For example, the third transistor T3 as the compensating transistor and the fourth transistor T4 as the first initializing transistor may be NMOS transistors, and the first transistor T1 as the driving transistor, the second transistor T2 as the data transfer transistor, the fifth transistor T5 as the first emission control transistor, the sixth transistor T6 as the second emission control transistor, and the seventh transistor T7 as the second initializing transistor may be PMOS transistors.

In this case, the active layers of the third transistor T3 and the fourth transistor T4 may include a different material from that of the active layers of the first transistor T1, the second transistor T2, the fifth transistor T5, the sixth transistor T6 and the seventh transistor T7. For example, the active layers of the third transistor T3 and the fourth transistor T4 may include oxide semiconductor, and the active layers of the first transistor T1, the second transistor T2, the fifth transistor T5, the sixth transistor T6 and the seventh transistor T7 may include polycrystalline silicon, but the present disclosure is not limited thereto.

The gate electrode of the first transistor T1 is connected to a first electrode of the capacitor Cst. The first electrode of the first transistor T1 is connected to a first supply voltage line ELVDDL for applying the first supply voltage ELVDD via the fifth transistor T5. The second electrode of the first transistor T1 is connected to the anode electrode of the light-emitting element LE via the sixth transistor T6. The first transistor T1 receives the data signal DATA according to a switching operation of the second transistor T2, to supply a driving current to the light-emitting diode LE.

The gate electrode of the second transistor T2 is connected to a first scan line for applying the first scan signal GW. The first electrode of the second transistor T2 is connected to a data signal (DATA) terminal. The second electrode of the second transistor T2 is connected to the first electrode of the first transistor T1, and is connected to the first supply voltage line ELVDDL via the fifth transistor T5. The second transistor T2 is turned on in response to the first scan signal GW, to transfer the data signal DATA to the first electrode of the first transistor T1.

The third transistor T3 may be implemented as a dual transistor including a first subsidiary transistor T3-1 and a second subsidiary transistor T3-2. The gate electrode of the first subsidiary transistor T3_1 is connected to the first scan signal line for applying the first scan signal GW, the first electrode of the first subsidiary transistor T3_1 is connected to the second electrode of the second subsidiary transistor T3_2, and the second electrode of the first subsidiary transistor T3_1 is connected to the first electrode of the capacitor Cst, the first electrode of a third subsidiary transistor T4_1, and the gate electrode of the first transistor T1. The gate electrode of the second subsidiary transistor T3_2 may be connected to the first scan signal line for applying the first scan signal GW, the first electrode of the second subsidiary transistor T3_2 may be connected to the second electrode of the first transistor T1, and the second electrode of the second subsidiary transistor T3_2 may be connected to the first electrode of the first subsidiary transistor T3_1.

The first subsidiary transistor T3_1 and the second subsidiary transistor T3_2 are turned on by the first scan signal GW to connect the gate electrode and the second electrode of the first transistor T1 to each other, so that the first transistor T1 is in a diode connection. Accordingly, a voltage difference equal to the threshold voltage of the first transistor T1 is generated between the first electrode and the gate electrode of the first transistor T1. Variations (e.g., deviations) in the threshold voltage of the first transistor T1 may be compensated for by supplying the data signal DATA that compensates for the threshold voltage to the gate electrode of the first transistor T1.

The fourth transistor T4 may be implemented as a dual transistor including the third subsidiary transistor T4_1 and a fourth subsidiary transistor T4_2. The gate electrode of the third subsidiary transistor T4_1 is connected to a second scan signal line for applying the second scan signal GI, the first electrode of the third subsidiary transistor T4_1 is connected to the first electrode of the capacitor Cst, the second electrode of the first subsidiary transistor T3_1, and the gate electrode of the first transistor T1, and the second electrode of the third subsidiary transistor T4_1 is connected to the first electrode of the fourth subsidiary transistor T4_2. The gate electrode of the fourth subsidiary transistor T4_2 may be connected to the second scan signal line for applying the second scan signal GI, the first electrode of the fourth subsidiary transistor T4_2 may be connected to the second electrode of the third subsidiary transistor T4_1, and the second electrode of the fourth subsidiary transistor T4_2 may be connected to an initialization voltage line for applying the initialization voltage VINT. The third subsidiary transistor T4_1 and the fourth subsidiary transistor T4_2 are turned on in response to the second scan signal GI, to transfer the initialization voltage VINT to the gate electrode of the first transistor T1, such that the voltage at the gate electrode of the first transistor T1 may be initialized.

The gate electrode of the fifth transistor T5 is connected to an emission control signal line for applying the emission control signal EM, the first electrode of the fifth transistor T5 is connected to the first supply voltage line ELVDDL, and the second electrode of the fifth transistor T5 is connected to the first electrode of the first transistor T1. The fifth transistor T5 is turned on by the emission control signal EM, to connect the first electrode of the first transistor T1 with the first supply voltage line ELVDDL.

The sixth transistor T6 is connected between the second electrode of the first transistor T1 and the first electrode of the light-emitting element LE. The gate electrode of the sixth transistor T6 is connected to the emission control signal line for applying the emission control signal EM, the first electrode of the sixth transistor T6 is connected to the second electrode of the first transistor T1 and the first electrode of the second subsidiary transistor T3_2, and the second electrode of the sixth transistor T6 is connected to the first electrode of the light-emitting element LE.

The fifth transistor T5 and the sixth transistor T6 are concurrently (e.g., simultaneously) turned on in response to the emission control signal EM, so that the driving current flows through the light-emitting diode LE.

The gate electrode of the seventh transistor T7 is connected to a third scan line for applying the third scan signal GB. The first electrode of the seventh transistor T7 is connected to the anode electrode of the light-emitting diode LE. The second electrode of the seventh transistor T7 is connected to the initialization voltage line for applying the initialization voltage VINT. The seventh transistor T7 is turned on in response to the third scan signal GB, to initialize the anode electrode of the light-emitting element LE.

Although the third scan signal GB is shown as applied to the gate electrode of the seventh transistor T7, the present disclosure is not limited thereto, and the pixel circuit may be configured such that the emission control signal EM or the second scan signal GI is applied to the gate electrode of the seventh transistor T7 in other embodiments.

The capacitor Cst is formed between the gate electrode of the first transistor T1 and the first supply voltage line ELVDDL, and includes a first electrode and a second electrode. The first electrode of the capacitor Cst may be connected to the gate electrode of the first transistor T1, the second electrode of the third transistor T3, and the first electrode of the fourth transistor T4, and the second electrode of the capacitor Cst may be connected to the first supply voltage line ELVDDL. The capacitor Cst may be used to regulate the data voltage applied to the gate electrode of the first transistor T1.

The cathode electrode of the light-emitting element LE is connected to a second supply voltage line ELVSSL for applying the second supply voltage ELVSS. The light-emitting element LE displays an image by receiving the driving current from the first transistor T1 to emit light.

Hereinafter, a planar arrangement and a cross-sectional structure of the pixel PX will be described in more detail.

Figure 4:
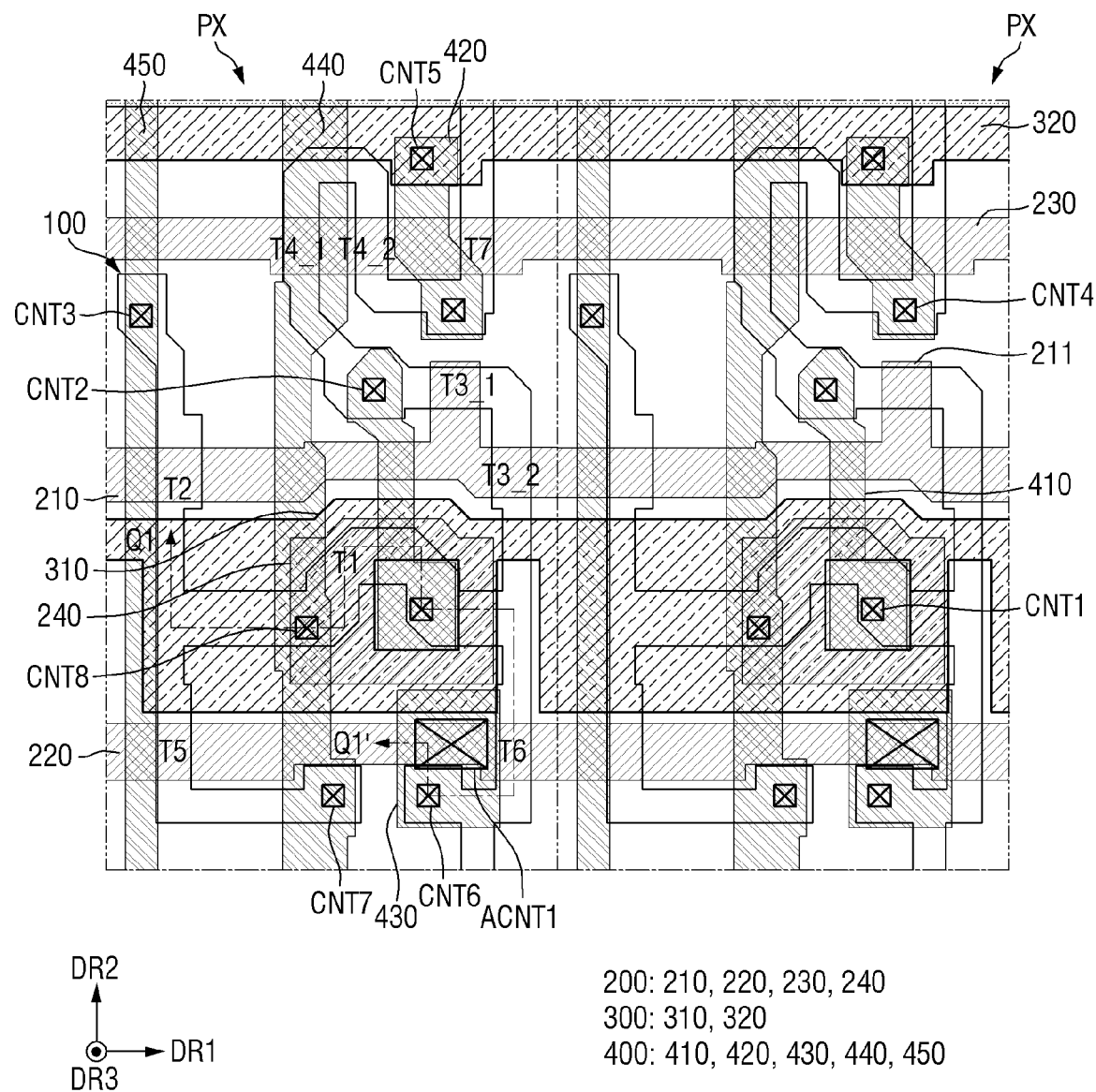
FIG. 4 is a view showing a layout of pixels in a display device according to an embodiment of the present disclosure.
Figure 5:
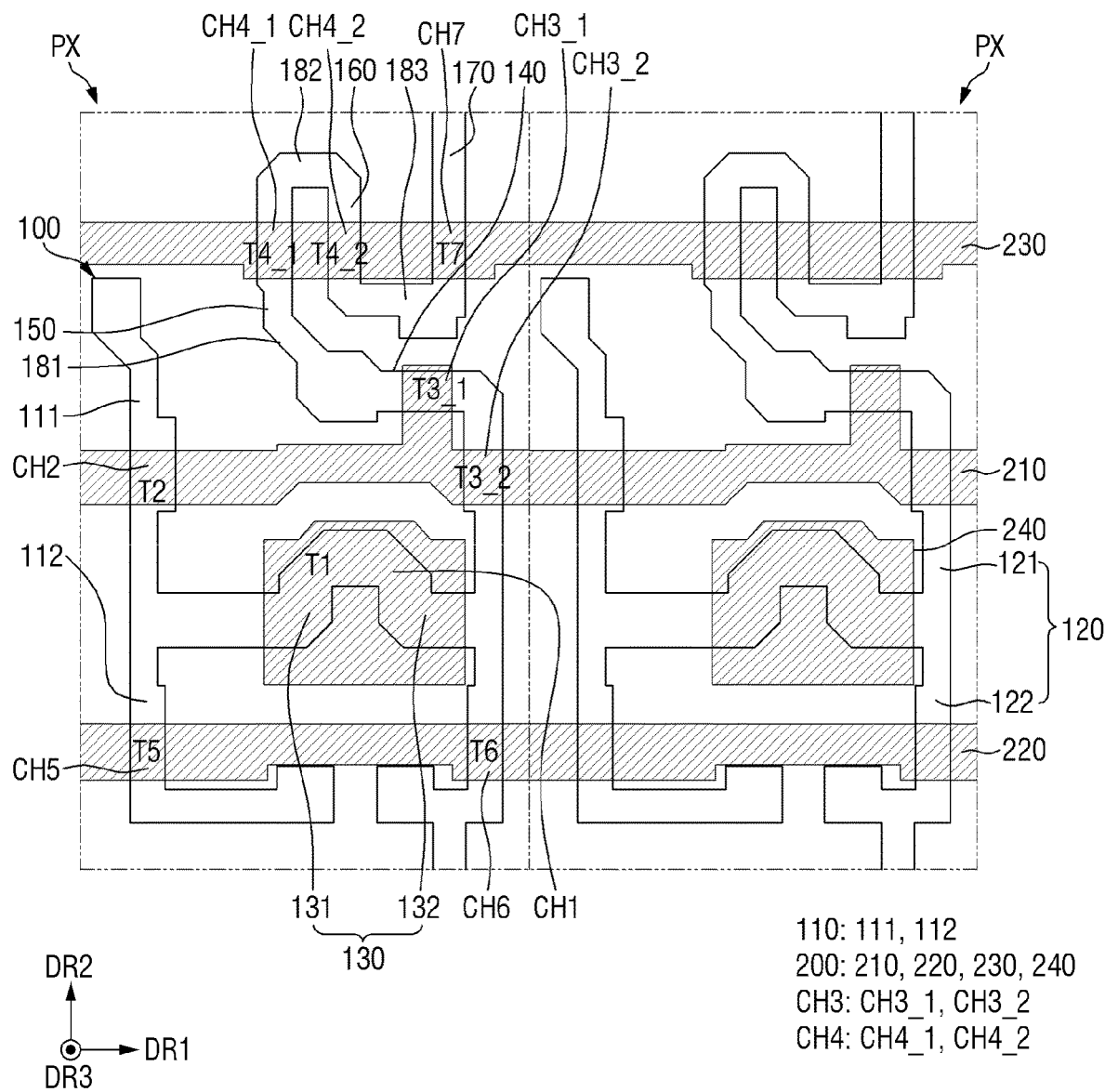
FIG. 5 is a view showing a layout of a semiconductor layer and a first conductive layer according to an embodiment of the present disclosure.
Figure 6:
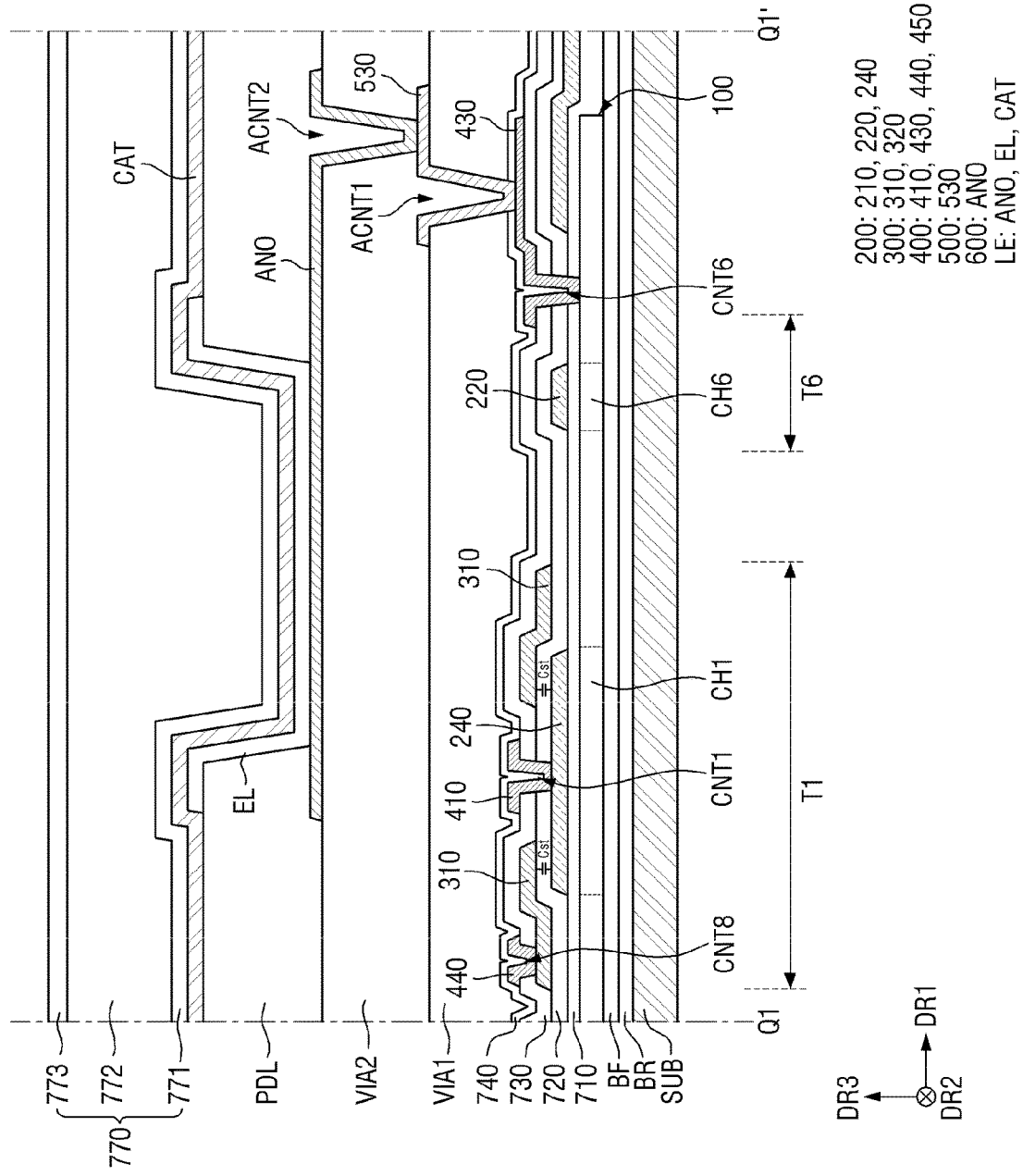
FIG. 6 is a cross-sectional view taken along the line Q1-Q1' of FIG. 4.

FIG. 4 is a view showing a layout of pixels in a display device according to an embodiment of the present disclosure. FIG. 5 is a view showing a layout of a semiconductor layer and a first conductive layer according to an embodiment of the present disclosure. FIG. 6 is a cross-sectional view taken along the line Q1-Q1' of FIG. 4. FIG. 6 further shows a fourth conductive layer 600 including an anode electrode ANO, an emission layer EL, a cathode electrode CAT, and a thin-film encapsulation layer 770 when compared to the view of FIG. 4.

Referring to FIGS. 4 to 6, as described above, each of the pixels PX includes a plurality of transistors T1 to T7, a capacitor Cst, and a light-emitting element LE (e.g., see FIG. 3).

The capacitor Cst includes various conductive layers forming the electrodes of the capacitor Cst, and an insulating layer disposed between the conductive layers. The light-emitting element LE includes various conductive layers forming an anode electrode and a cathode electrode, and an organic light emitting layer disposed therebetween. The elements may be electrically connected with one another by lines formed of conductive layers and/or vias including (e.g., made of) a conductive material. The above-described conductive material, conductive layers, semiconductor layers, insulating layers, light emitting layer, and the like are disposed on a substrate SUB.

The layers of the pixel PX may be disposed in an order of the substrate SUB, a barrier layer BR, a buffer layer BF, a semiconductor layer 100, a first insulating layer 710, a first conductive layer 200, a second insulating layer 720, a second conductive layer 300, a third insulating layer 730, a third conductive layer 400, a protective film 740, a first via layer VIA1, a fourth conductive layer 500, a second via layer VIA2, a fifth conductive layer 600, a pixel-defining film PDL, a light emitting layer EL, and a cathode electrode CAT. Each of the layers described above may include (e.g., may be made up of) a single film, or a stack of multiple films. Other layers may be further disposed between the layers described above.

The substrate SUB supports the layers disposed thereon. A transparent substrate may be used when the organic light-emitting display device is of a bottom-emission or double-sided emission type. When the organic light-emitting display device is of a top-emission type, a semi-transparent or opaque substrate as well as a transparent substrate may be employed.

The substrate SUB may include (e.g., may be made of) an insulating material, such as glass, quartz, and/or a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a suitable combination thereof. The substrate SUB may include a metal material.

The substrate SUB may be a rigid substrate, or a flexible substrate that may be bent, folded, rolled, and/or the like. An example of the material of the flexible substrate may include, but is not limited to, polyimide (PI).

The barrier layer BR may be disposed on the substrate SUB. The barrier layer BR may be disposed entirely on the substrate SUB. The barrier layer BR may prevent or substantially prevent impurity ions from diffusing therethrough, may prevent or substantially prevent permeation of moisture and/or outside air therethrough, and may provide a flat or substantially flat surface. The barrier layer BR may include silicon oxide (SiOx). However, that the present disclosure is not limited thereto. For example, the barrier layer BR may include silicon nitride (SiNx), silicon oxynitride (SiOxNy), and/or the like. The barrier layer BR may be omitted as needed or desired, for example, depending on the type of the substrate SUB, process conditions, and/or the like.

The buffer layer BF may be disposed on the barrier layer BR. The buffer layer BF may be disposed entirely on the barrier layer BR. The buffer layer BF may prevent or substantially prevent impurity ions from diffusing therethrough, may prevent or substantially prevent permeation of moisture and/or outside air therethrough, and may provide a flat or substantially flat surface. The buffer layer BF may include silicon nitride. However, the present disclosure is not limited thereto, and the buffer layer BF may include silicon oxide, silicon oxynitride, and/or the like. The buffer layer BF may be omitted as needed or desired, for example, depending on the type of the substrate SUB, process conditions, and/or the like.

The semiconductor layer 100 may be disposed on the buffer layer BF. The semiconductor layer 100 is an active layer forming a first region and a second region that are in contact with the first electrode and the second electrode of each of the first to seventh transistors T1 to T7, respectively, and channels CH1 to CH7 (e.g., channel regions). One of the first region and the second region may be a source region, and the other one of the first region and the second region may be a drain region. In other words, the semiconductor layer 100 may include the channels CH1, CH2, CH3, CH4, CH5, CH6 and CH7, and the source region and the drain region of each of the first to seventh transistors T1 to T7.

As used in the following description, in a plan view, a first side in the first direction DR1 will refer to the right side, and a second side in the first direction DR1 will refer to the left side. Further, in a plan view, a first side in the second direction DR2 will refer to the upper side, and a second side in the second direction DR2 will refer to the lower side.

The semiconductor layer 100 may not be disposed separately for each of the pixels PX, but may be disposed continuously across the pixels PX. The first semiconductor layer 100 may have a suitable pattern (e.g., a certain or predetermined pattern) in a plan view (e.g., when viewed from the top). For example, the first semiconductor layer 100 may include a plurality of vertical portions that generally extend in the second direction DR2, a plurality of horizontal portions that generally extend in the first direction DR1, and a plurality of connecting portions connecting some of the vertical portions with some of the horizontal portions. The vertical portions may include a first vertical portion 110, a second vertical portion 120, a third vertical portion 150, a fourth vertical portion 160, and a fifth vertical portion 170 that generally extend in the second direction DR2. The horizontal portions may include a first horizontal portion 130 and a second horizontal portion 140 that generally extend in the first direction DR1. The connecting portions may include first to third connecting portions 181, 182 and 183 connecting some of the plurality of vertical portions 110, 120, 150, 160 and 170 with the plurality of horizontal portions 130 and 140. The plurality of vertical portions 110, 120, 150, 160 and 170, the plurality of horizontal portions 130 and 140, and the first to third connecting portions 181, 182 and 183 may be physically connected to one another.

The first vertical portion 110 may be disposed to be adjacent to the second side (e.g., the left side) of a pixel PX in the first direction DR1, and the second vertical portion 120 may be disposed to be adjacent to the first side (e.g., the right side) of the pixel PX in the first direction DR1. The first vertical portion 110 and the second vertical portion 120 may be spaced apart from each other. The first horizontal portion 130 may connect a middle of the first vertical portion 110 with a middle of the second vertical portion 120. The first vertical portion 110 may include an upper part 111 and a lower part 112, and the second vertical portion 120 may include an upper part 121 and a lower part 122. The upper parts 111 and 121 of the first vertical portion 110 and the second vertical portion 120 may refer to parts that are located on the first side (e.g., the upper side) of the first horizontal portion 130 in the second direction DR2 in a plan view (e.g., when viewed from the top), and the lower parts 112 and 122 of the first vertical portion 110 and the second vertical portion 120 may refer to parts that are located on the second side (e.g., the lower side) of the first horizontal portion 130 in the second direction DR2 in a plan view (e.g., when viewed from the top). A combined shape of the first vertical portion 110, the second vertical portion 120, and the first horizontal portion 130 may be the same or substantially the same as (or similar to) an 'H' shape in a plan view (e.g., when viewed from the top).

The first horizontal portion 130 may connect the first vertical portion 110 with the second vertical portion 120 by a shortest distance therebetween, or may include a first bent part 131 on the second side (e.g., the left side) thereof in the first direction DR1 and a second bent part 132 on the first side (e.g., the right side) thereof in the first direction DR1.

The second horizontal portion 140 may extend from one end of the upper part 121 of the second vertical portion 120 on the first side (e.g., the upper side) of the upper part 121 in the second direction DR2 toward the second side (e.g., the left side) of the pixel PX in the first direction DR1, and may be disposed to be closer to the first side (e.g., the upper side) of the pixel PX in the second direction DR2 than the first horizontal portion 130.

The third vertical portion 150, the fourth vertical portion 160, and the fifth vertical portion 170 may be disposed on the first side of the second horizontal portion 140 in the second direction DR2. The third vertical portion 150 may be disposed on the second side of the fifth vertical portion 170 in the second direction DR2, and the fourth vertical portion 160 may be disposed between the third vertical portion 150 and the fifth vertical portion 170. The end of the fifth vertical portion 170 on the second side in the second direction DR2 may be connected to the fourth vertical portion 160, while the other end of the fifth vertical portion 170 on the first side in the second direction DR2 may be connected to the lower part 122 of the second vertical portion of an adjacent pixel PX.

The first connecting portion 181 may be disposed between the end of the second horizontal portion 140 on the second side in the first direction DR1 and the end of the third vertical portion 150 on the second side in the second direction DR2. The first connecting portion 181 may connect the second horizontal part 140 with the third vertical portion 150, and may be formed to be inclined with respect to the first direction DR1 and the second direction DR2.

The second connecting portion 182 may be disposed between the end of the third vertical portion 150 on the first side in the second direction DR2 and the end of the fourth vertical portion 160 on the first side in the second direction DR2. The second connecting portion 182 may connect the third vertical portion 150 with the fourth vertical portion 160.

The third connecting portion 183 may be disposed between the end of the fourth vertical portion 160 on the second side in the second direction DR2 and the end of the fifth vertical portion 160 on the second side in the second direction DR2. The third connecting portion 183 may connect the fourth vertical portion 160 with the fifth vertical portion 170.

The channels CH1 to CH7 of the transistors T1 to T7 may be formed where the semiconductor layer 100 and the first conductive layer 200 overlap with each other. The channel CH3 of the third transistor T3 may include a first sub-channel CH3_1 that is a channel of the first sub-transistor T3_1, and a second sub-channel CH3_2 that is a channel of the second sub-transistor T3_2. The channel CH4 of the fourth transistor T4 may include a third sub-channel CH4_1 that is a channel of the third sub-transistor T4_1, and a fourth sub-channel CH4_2 that is a channel of the fourth sub-transistor T42.

The channel CH1 of the first transistor T1 may be located at a part of the first horizontal portion 130 that overlaps with the gate electrode 240 of the first transistor T1. The channel CH2 of the second transistor T2 may be located at the upper part 111 of the first vertical portion overlapping with a first scan line 210. The channel CH3_1 of the first sub-transistor T3_1 may be located at the second horizontal portion 140 overlapping with the first scan line 210, and the channel CH3_2 of the second sub-transistor T3_2 may be located at the upper part 121 of the second vertical portion overlapping with the first scan line 210. The channel CH4_1 of the third sub-transistor T4_1 may be located at the third vertical portion 150 overlapping with a second scan line 230, and the channel CH4_2 of the fourth sub-transistor T4_2 may be located at the fourth vertical portion 160 overlapping with the second scan line 230. The channel CH5 of the fifth transistor T5 may be located at the lower part 112 of the first vertical portion overlapping with the emission control line 220. The channel CH6 of the sixth transistor T6 may be located at the lower part 122 of the second vertical portion overlapping with the emission control line 220. The channel CH7 of the seventh transistor T7 may be located at the fifth vertical portion 170 overlapping with the second scan line 230.

The channel of the driving transistor T1 and the channels of the switching transistors (e.g., T2 to T7) may include the same impurity ions. In other words, the channel of the driving transistor may include first impurity ions and second impurity ions that are different from each other, and the channel of the switching transistor may also include the first impurity ions and second impurity ions that are different from each other.

The channel CH1 of the first transistor T1 may include a first impurity ion comprising Group V element, and a second impurity ion comprising Group III element. Each of the channels CH2, CH3, CH4, CH5, CH6, and CH7 of the second to seventh transistors T2, T3, T4, T5, T6, and T7 may include a first impurity ion comprising Group V element, and a second impurity ion comprising Group III element. In an ion implantation process, by an accelerating voltage, the first impurity ions and the second impurity ions may be accelerated to be irradiated toward the semiconductor layer 100, and accordingly, the channel region of each of the transistors may be doped with the first impurity ions and the second impurity ions.

The Group III element may include, but is not limited to, boron (B) as Group III element, and the Group V element may include phosphorus (P) as Group V element. In this case, the channels CH1, CH2, CH3, CH4, CH5, CH6, and CH7 of the first to seventh transistors T1, T2, T3, T4, T5, T6, and T7 may include boron (B) and phosphorus (P).

However, that the present disclosure is not limited thereto. For example, the channel of the driving transistor and the channels of the switching transistors may include different impurity ions. In other words, the channel of the driving transistor may include first impurity ions and second impurity ions that are different from each other, and the channel of the switching transistors may include one of the first impurity ions or the second impurity ions. For example, the channel of each of the switching transistors may include the second impurity ion but not the first impurity ion. In other words, the channel of the driving transistor and the channel of each of the switching transistors may include the first impurity ion, and the channel of the driving transistor may further include the second impurity ion.

When the channels CH1, CH2, CH3, CH4, CH5, CH6, and CH7 of the first to seventh transistors T1, T2, T3, T4, T5, T6, and T7 include boron (B) and phosphorus (P), issues relating to hysteresis and image retention may be improved.

Figure 7:
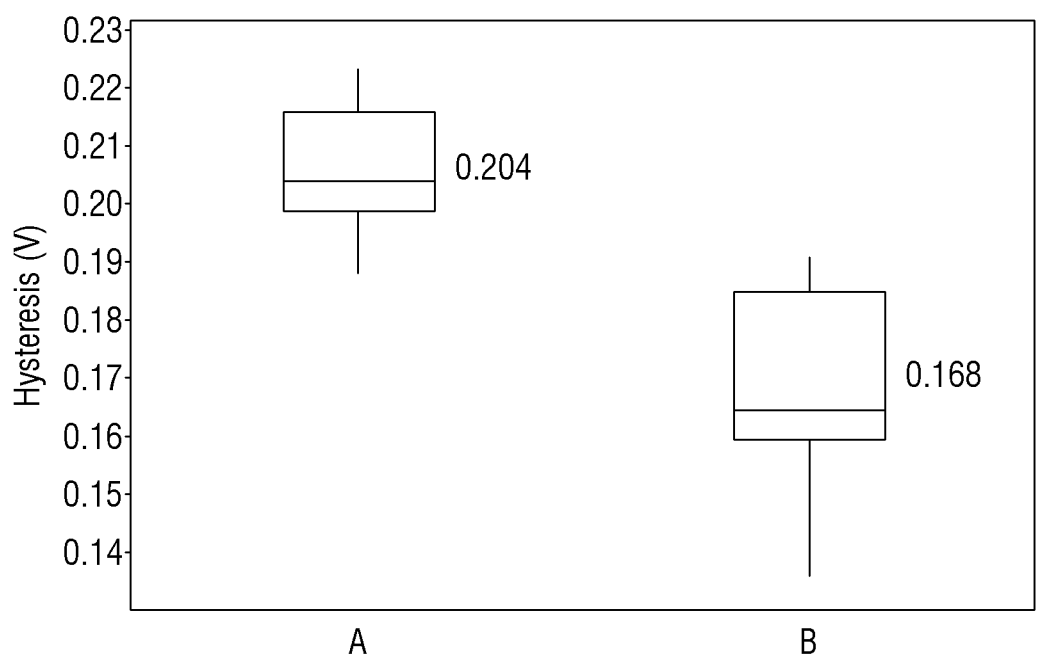
FIG. 7 is a graph illustrating a hysteresis versus impurity ions doped into the channel of the driving transistor.

FIG. 7 is a graph illustrating a hysteresis versus impurity ions doped into the channel of the driving transistor.

Referring to FIG. 7, A represents a hysteresis when the channel of the driving transistor is doped with boron (B) such that the channel contains boron (B). B represents a hysteresis when the channel of the driving transistor is doped with boron (B) and phosphorus (P) such that the channel contains boron (B) and phosphorus (P).

Comparing A with B, the average hysteresis of A in which the channel region of the driving transistor is doped with only boron (B) is 0.204, whereas the average hysteresis of B in which the channel region of the driving transistor is doped with boron (B) and phosphorus (P) is 0.168. In other words, in the case of B in which the channel region of the driving transistor is doped with boron (B) and phosphorus (P), the driving transistor exhibits lower hysteresis than that of the case of A in which the channel region of the driving transistor is doped with only boron (B). As the channel region of the driving transistor is doped with boron (B) and phosphorus (P), hysteresis may be reduced, and thus, issues relating to hysteresis may be improved.

Figure 8:
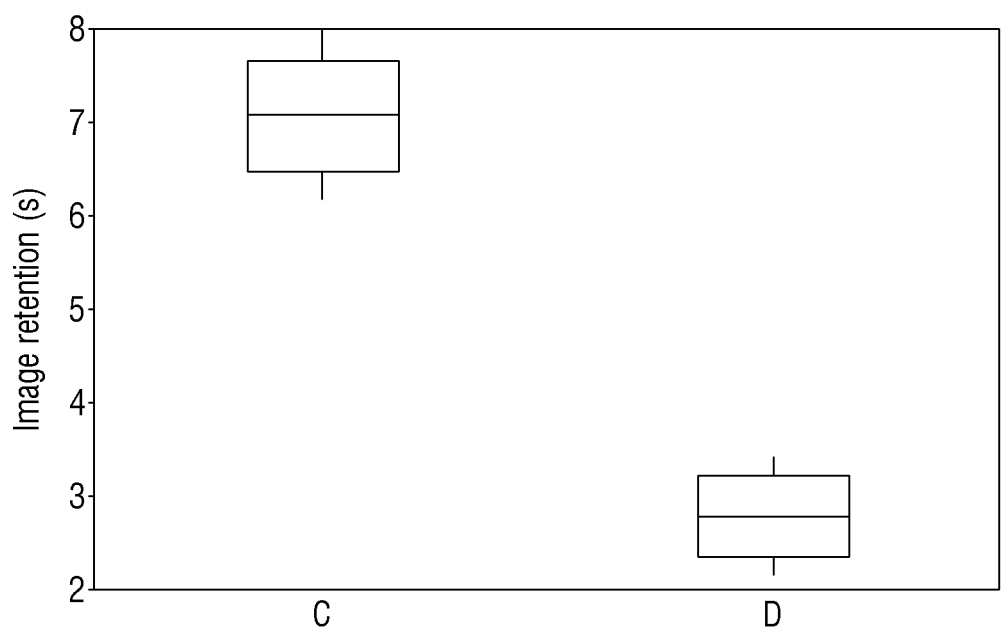
FIG. 8 is a graph illustrating image retention versus impurity ions doped into the channel of the driving transistor.

FIG. 8 is a graph illustrating image retention versus impurity ions doped into the channel of the driving transistor.

Referring to FIG. 8, C represents image retention when the channel of the driving transistor is doped with boron (B), and thus, the channel contains boron (B). D represents image retention when the channel of the driving transistor is doped with boron (B) and phosphorus (P), and thus, the channel contains boron (B) and phosphorus (P).

Comparing C with D, the average image retention of C in which the channel region of the driving transistor is doped with only boron (B) is approximately 7 seconds, whereas the average image retention of D in which the channel region of the driving transistor is doped with boron (B) and phosphorus (P) is approximately 2.7 seconds. In other words, in the case of D in which the channel region of the driving transistor is doped with boron (B) and phosphorus (P), the driving transistor exhibits shorter image retention than that of the case of C in which the channel region of the driving transistor is doped with only boron (B). As the channel region of the driving transistor is doped with boron (B) and phosphorus (P), image retention may be reduced, and thus, issues relating to image retention may be improved.

Accordingly, when the channel CH1 of the first transistor T1 (e.g., the driving transistor) is doped with boron (B) and phosphorus (P), and thus, contains boron (B) and phosphorus (P), hysteresis and image retention may be reduced, and thus, issues relating to hysteresis and image retention may be improved.

On the other hand, when the channel of the switching transistor is doped with boron (B) and phosphorus (P), device characteristics of the switching transistor may be deteriorated due to an increase in a doping amount. According to one or more embodiments of the present disclosure, as discussed in more detail below, the regions doped with boron (B) and phosphorus (P) are partitioned in the channels of the driving transistor and the switching transistors, thereby improving the issues relating to hysteresis and image retention, while preventing or substantially preventing the device characteristics of the switching transistors from being deteriorated.

Figure 9:
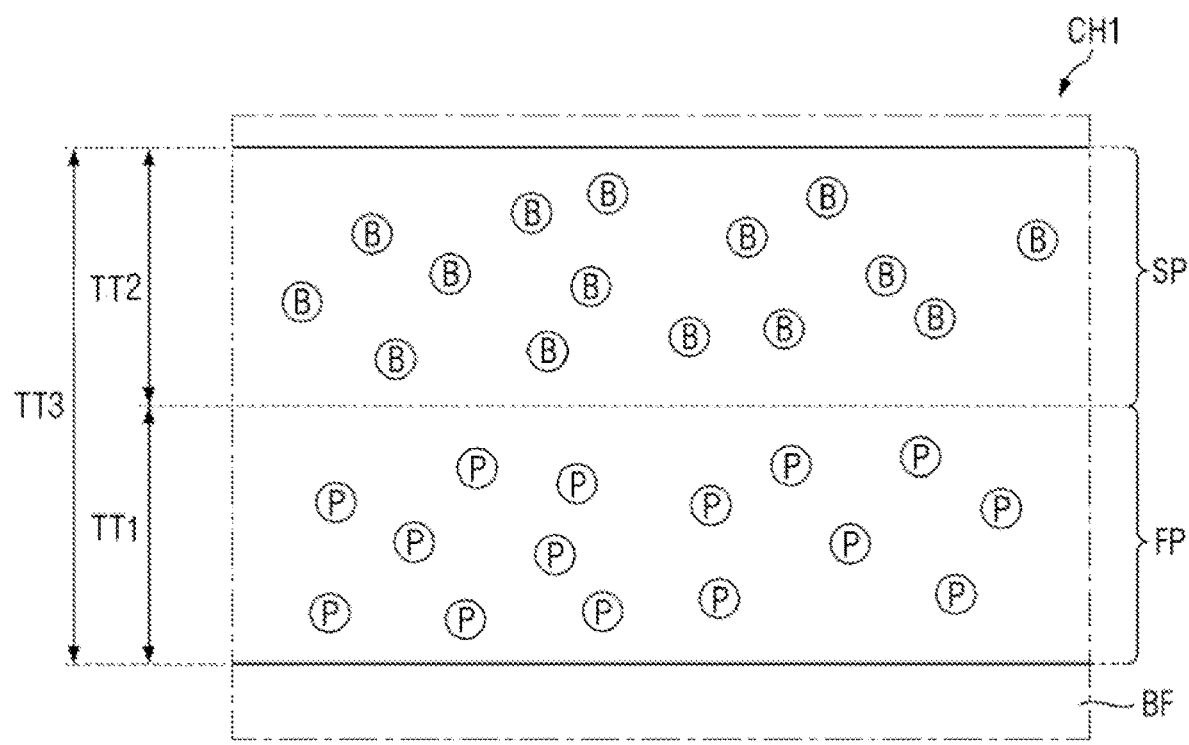
FIG. 9 is a cross-sectional view schematically illustrating a channel of a first transistor according to an embodiment of the present disclosure.

FIG. 9 is a cross-sectional view schematically illustrating a channel of a first transistor according to an embodiment of the present disclosure.

Referring to FIG. 9, the channel CH1 of the first transistor T1 (e.g., the driving transistor) according to an embodiment of the present disclosure may include boron (B) and phosphorus (P). Although the channel CH1 of the first transistor T1, which is the driving transistor, will be described in more detail below with reference to FIG. 9 as an example, the present disclosure is not limited thereto. For example, the below description with reference to FIG. 9 may be applied (e.g., may be equally applied) to the channels CH2, CH3, CH4, CH5, CH6 and CH7 of the second to seventh transistors T2, T3, T4, T5, T6 and T7, which are switching transistors.

In more detail, the channel CH1 of the first transistor T1 may include a first region FP containing Group V element (e.g., phosphorus (P)), and a second region SP containing Group III element (e.g., boron (B)).

The first region FP may form a bottom of the channel CH1, and may be disposed to be adjacent to or in contact with the buffer layer BF. The first region FP may be disposed under (e.g., underneath) the second region SP. The first region FP may contain Group 5 element, for example, such as phosphorus (P). By disposing the first region FP containing phosphorus (P) at the bottom of the channel CH1, and disposing the second region SP at the top of the channel CH1, it may be possible to reduce defects in the channel CH1 to improve issues relating to image retention.

The first region FP may have a suitable thickness (e.g., a predetermined thickness) in the channel CH1 to include phosphorus (P). According to an embodiment of the present disclosure, the thickness TT1 of the first region FP may be in a range of approximately 100 Å to 400 Å. The channel CH1 may be easily formed when the thickness TT1 of the first region FP is approximately 100 Å or more. Phosphorus (P) may be uniformly or substantially uniformly doped when the thickness TT1 of the first region FP is approximately 400 Å or less. However, the present disclosure is not limited thereto.

The second region SP may form the top of the channel CH1, and may be disposed on the first region FP. The second region SP may be disposed to be farther from the buffer layer BF than the first region FP, and may be disposed to be adjacent to the gate electrode (e.g., of the first transistor T1). The second region SP may overlap with the first region FP, and a lower surface of the second region SP may be in contact with an upper surface of the first region FP. The second region SP contains Group III element, for example, such as boron (B). By disposing the second region SP containing boron (B) at the top of the channel CH1, it may be possible to reduce defects of the channel CH1 to thereby improve image retention.

The second region SP may have a suitable thickness (e.g., a predetermined thickness) in the channel CH1 to include boron (B). According to an embodiment of the present disclosure, the thickness TT2 of the second region SP may be in a range of approximately 70 Å to 370 Å. The channel CH1 may be easily formed when the thickness TT2 of the second region FP is approximately 70 Å or more. Boron (B) may be uniformly or substantially uniformly doped when the thickness TT2 of the second region SP is approximately 370 Å or less. However, the present disclosure is not limited thereto.

The channel CH1 may have a suitable thickness (e.g., a predetermined thickness) so that the first region FP and the second region SP may be easily formed. According to an embodiment of the present disclosure, the thickness TT3 of the channel CH1 may be in a range of approximately 170 Å to 770 Å. The thickness TT3 of the channel CH1 may be the sum of the thickness TT1 of the first region FP and the thickness TT2 of the second region SP.

According to the present embodiment, boron (B) may be located at a location adjacent to the surface (e.g., the top surface) of the channel CH1, where electrons and holes substantially move in the channel CH1 of the first transistor T1. When phosphorus (P) is located at the surface (e.g., the top surface) of the channel CH1, the phosphorus (P) may act as a defect. Therefore, by disposing boron (B) at the surface (e.g., the top surface) of the channel CH1 and separating the phosphorus (P) therefrom, it may be possible to further improve the issues relating to image retention in the display device.

Figure 10:
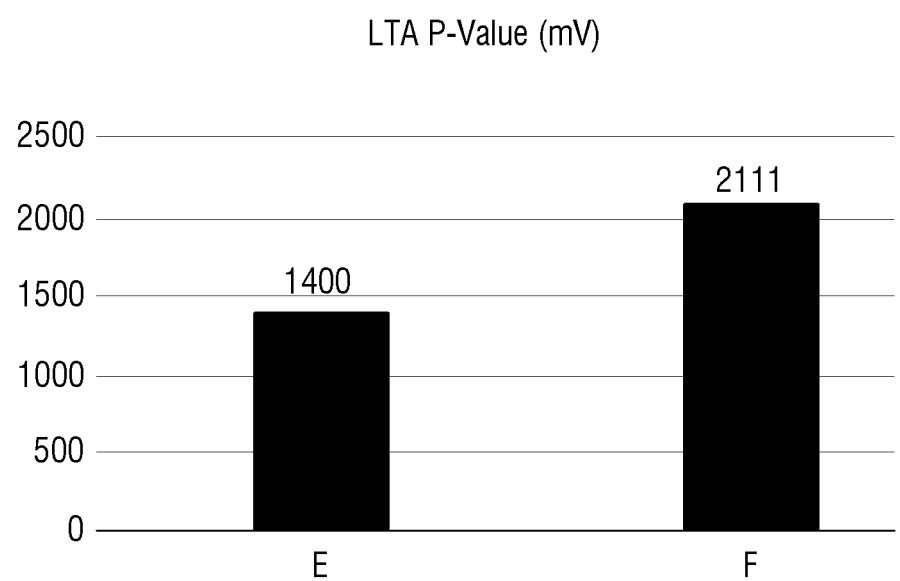
FIG. 10 is a graph illustrating an average P-Value of lifetime analysis versus impurity ions doped into the channel of the driving transistor.

FIG. 10 is a graph illustrating an average P-Value of lifetime analysis versus impurity ions doped into the channel of the driving transistor.

Referring to FIG. 10, E represents the average P-Value when the channel of the driving transistor (e.g., the first transistor) is doped with boron (B) and phosphorus (P), and boron (B) and phosphorus (P) are mixed with each other in the entire channel. F represents the average P-Value when the channel of the driving transistor is doped with boron (B) and phosphorus (P) in the separated structure shown in FIG. 9. In this regard, a larger P-Value of lifetime analysis (LTA) may correspond to fewer defects. Table 1 below summarizes the minimum, maximum, and average values of the P-Value of the lifetime analysis.

TABLE 1

|   | Minimum Value | Maximum Value | Average |
|---|---|---|---|
| E | 1,052 | 1,749 | 1,400 |
| F | 1,978 | 2,245 | 2,111 |

When E and F are compared with each other, with reference to FIG. 10 and Table 1, the P-Value of E in which the channel of the driving transistor is doped with boron (B) and phosphorus (P) and mixed with each other in the entire channel is approximately 1,400 mV. The P-Value of F in which the channel of the driving transistor is doped with boron (B) and phosphorus (P) in the separated structure so that phosphorus (P) is located at the bottom of the channel while boron (B) is located at the top of the channel is approximately 2,111 mV. In other words, in the case of F in which only boron (B) is disposed on the surface (e.g., the top surface) of the channel of the driving transistor, the driving transistor exhibited a higher average P-Value than that of the case of E in which boron (B) and phosphorus (P) are mixed with each other. Thus, by disposing boron (B) at the surface (e.g., the top surface) of the channel of the driving transistor and phosphorus (P) at the bottom of the channel opposite to the surface (e.g., the top surface), it may be possible to improve defects that may occur in the channel.

Figure 11:
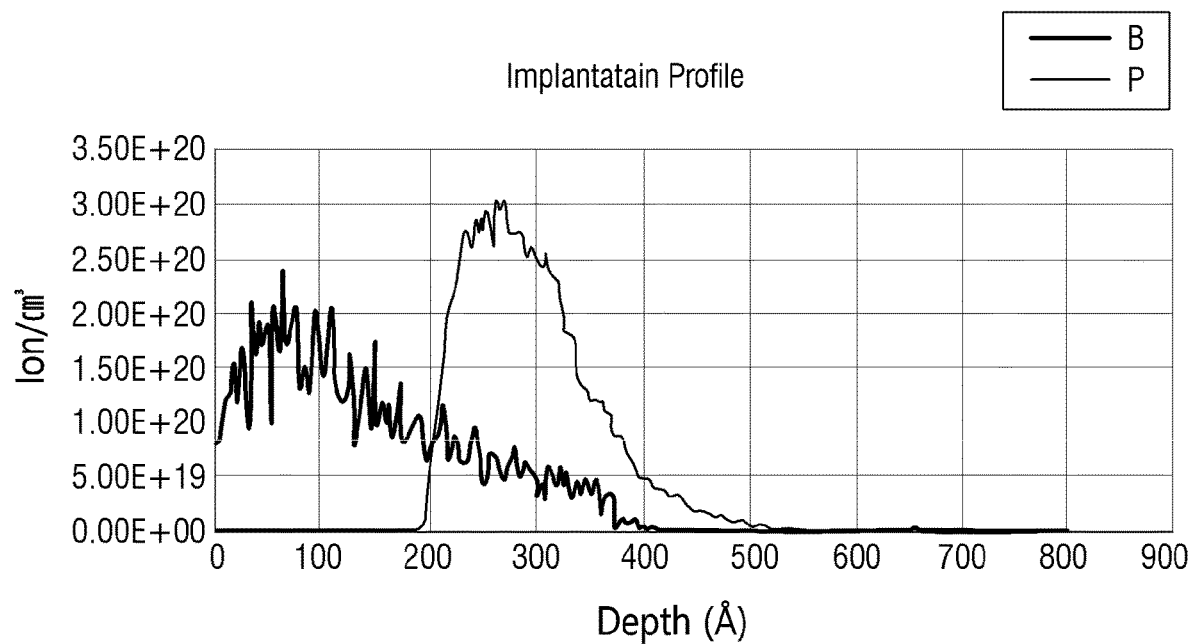
FIG. 11 is a graph showing results of measuring amounts of boron and phosphorus in the channel of the first transistor by secondary ion mass spectrometry (SIMS).

FIG. 11 is a graph showing results of measuring amounts of boron and phosphorus in the channel of the first transistor by secondary ion mass spectrometry (SIMS). In the graph of FIG. 11, the horizontal axis (the X-axis) represents a depth (e.g., a thickness) of the channel, and the vertical axis (the Y-axis) represents an amount of ions.

Referring to FIG. 11, only boron (B) exists in the range of approximately 190 Å from the surface of the channel, boron (B) and phosphorus (P) exist together in the range of approximately 190 Å to 400 Å, and only phosphorus (P) exists in the range of approximately 400 Å to 500 Å. In other words, because only boron (B) exists in the surface of the channel of the driving transistor, defects in the channel may be improved.

Referring again to FIGS. 4 to 6, the semiconductor layer 100 may include polycrystalline silicon. Polycrystalline silicon may be formed by crystallizing amorphous silicon. Examples of crystallizing techniques may include, but is not limited to, rapid thermal annealing (RTA), solid phase crystallization (SPC), excimer laser annealing (ELA), metal induced crystallization (MIC), metal induced lateral crystallization (MILC), sequential lateral solidification (SLS), and the like. As another example, the semiconductor layer 100 may include monocrystalline silicon, low-temperature polycrystalline silicon, amorphous silicon, or the like, or may include an oxide semiconductor.

The first insulating layer 710 may be disposed on the semiconductor layer 100, and may be disposed over the entire surface of the substrate SUB. The first insulating layer 710 may be a gate insulating layer having a gate insulating function.

The first insulating layer 710 may include a silicon compound, a metal oxide, and/or the like. For example, the first insulating layer 710 may include silicon oxide, silicon nitride, silicon oxynitride, aluminum oxide, tantalum oxide, hafnium oxide, zirconium oxide, titanium oxide, and/or the like. These materials may be used alone or in various suitable combinations with each other.

The first conductive layer 200 is disposed on the first insulating layer 710. The first conductive layer 200 may include the first scan line 210 that transmits the first scan signal GW, the gate electrode 240 of the first transistor T1, the emission control line 220 that transmits the emission control signal EM, and the second scan line 230 for supplying the second scan signal GI (e.g., see FIG. 3).

The first scan line 210 may include the gate electrodes of the second transistor T2, the first sub-transistor T3_1, and the second sub-transistor T3_2. The emission control line 220 may include the gate electrode of the fifth transistor T5 and the gate electrode of the sixth transistor T6. In addition, the second scan line 230 may include the gate electrodes of the third sub-transistor T4_1, the fourth sub-transistor T4_2, and the seventh transistor T7.

Each of the first scan line 210, the emission control line 220, and the second scan line 230 may extend in the first direction DR1. Each of the first scan line 210, the emission control line 220, and the second scan line 230 may extend to a neighboring pixel (e.g., an adjacent pixel) PX in the first direction DR1 beyond the boundary of the pixels PX.

The first scan line 210 may be located the center of the pixel PX and may overlap with the upper part 111 of the first vertical portion and the upper part 121 of the second vertical portion of the semiconductor layer 100.

The first scan line 210 may form the gate electrode of the second transistor T2 at a region where the first scan line 210 overlaps with the upper part 111 of the first vertical portion 110 of the semiconductor layer 100. The first vertical portion 110 of the semiconductor layer 100 located on the first side of the region in the second direction DR2 may be the first region of the second transistor T2. The first vertical portion 110 of the semiconductor layer 100 located on the second side of the region in the second direction DR2 may be the second region of the second transistor T2.

The first scan line 210 may form the gate electrode of the second subsidiary transistor T3_2 at a region where the first scan line 210 overlaps with the upper part 121 of the second vertical portion of the semiconductor layer 100. The second vertical portion 120 of the semiconductor layer 100 located on the first side of the region in the second direction DR2 may be the second region of the second subsidiary transistor T3_2. The second vertical portion 120 of the semiconductor layer 100 located on the second side of the region in the second direction DR2 may be the first region of the second subsidiary transistor T3_2.

The first scan line 210 may further include a first scan line protrusion 211. The first scan line protrusion 211 may protrude from the first scan line 210 extending in the first direction DR1 toward the first side in the second direction DR2.

The first scan line protrusion 211 may overlap with the second horizontal portion 140 of the semiconductor layer 100 to form the gate electrode of the first sub-transistor T3_1. The second horizontal portion 140 of the semiconductor layer 100 located on the first side of the region in the first direction DR1 may be the first region of the first subsidiary transistor T3_1. The second horizontal portion 140 of the semiconductor layer 100 located on the second side of the region in the first direction DR1 may be the second region of the first subsidiary transistor T3_1.

The emission control line 220 may be located on the second side of the pixel PX in the second direction DR2 in a plan view (e.g., when viewed from the top), and may overlap with the lower part 112 of the first vertical portion 110 and the lower part 122 of the second vertical portion 120 of the semiconductor layer 100.

The emission control line 220 may form the gate electrode of the fifth transistor T5 at a region where the emission control line 220 overlaps with the lower part 112 of the first vertical portion 110 of the semiconductor layer 100. The first vertical portion 110 of the semiconductor layer 100 located on the first side of the region in the second direction DR2 may be the second region of the fifth transistor T5. The first vertical portion 110 of the semiconductor layer 100 located on the second side of the region in the second direction DR2 may be the first region of the fifth transistor T5.

The emission control line 220 may form the gate electrode of the sixth transistor T6 at a region where the emission control line 220 overlaps with the upper part 121 of the second vertical portion. The second vertical portion 120 of the semiconductor layer 100 located on the first side of the region in the second direction DR2 may be the first region of the sixth transistor T6. The second vertical portion 120 of the semiconductor layer 100 located on the second side of the region in the second direction DR2 may be the second region of the sixth transistor T6.

The second scan line 230 may be located on the first side of the pixel PX in the second direction DR2 in a plan view (e.g., when viewed from the top), and may overlap with the third vertical portion 150, the fourth vertical portion 160, and the fifth vertical portion 170 of the semiconductor layer 100.

The second scan line 230 may form the gate electrode of the third subsidiary transistor T4_1 at a region where the second scan line 230 overlaps with the third vertical portion 150 of the semiconductor layer 100. The third vertical portion 150 of the semiconductor layer 100 located on the first side of the region in the second direction DR2 may be the second region of the third subsidiary transistor T4_1. The third vertical portion 150 of the semiconductor layer 100 located on the second side of the region in the second direction DR2 may be the first region of the third subsidiary transistor T4_1.

The second scan line 230 may form the gate electrode of the fourth subsidiary transistor T4_2 at a region where the second scan line 230 overlaps with the fourth vertical portion 160 of the semiconductor layer 100. The fourth vertical portion 160 of the semiconductor layer 100 located on the first side of the region in the second direction DR2 may be the first region of the third subsidiary transistor T4_1. The fourth vertical portion 160 of the semiconductor layer 100 located on the second side of the region in the second direction DR2 may be the second region of the fourth subsidiary transistor T4_2.

The second scan line 230 may form the gate electrode of the seventh transistor T7 at a region where the second scan line 230 overlaps with the fifth vertical portion 170 of the semiconductor layer 100. The fifth vertical portion 170 of the semiconductor layer 100 located on the first side of the region in the second direction DR2 may be the second region of the seventh transistor T7. The fifth vertical portion 170 of the semiconductor layer 100 located on the second side of the region in the second direction DR2 may be the first region of the seventh transistor T7.

The gate electrodes of the second to seventh transistors T2 to T7 may have an expanded width, but the present disclosure is not limited thereto.

The gate electrode 240 of the first transistor T1 may be located at the center of the pixel PX. The gate electrode 240 of the first transistor T1 may be located between the first scan line 210 and the emission control line 220 in a plan view (e.g., when viewed from the top). The gate electrode 240 of the first transistor T1 may be disposed separately for each of the pixels PX.

The gate electrode 240 of the first transistor T1 overlaps with the first horizontal portion 130 of the semiconductor layer 100. With respect to the location where the gate electrode 240 and the first horizontal portion 130 overlap with each other, the first horizontal portion 130 of the semiconductor layer 100 located on the left side of the location may be the first region of the first transistor T1, while the first horizontal portion 130 of the semiconductor layer 100 located on the right side of the location may be the second region of the first transistor T1.

The first conductive layer 200 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 720 may insulate the first conductive layer 200 from the second conductive layer 300. The second insulating layer 720 may be disposed on the first conductive layer 200, and may be disposed generally on the entire surface of the substrate SUB. The second insulating layer 720 may be an interlayer dielectric film.

The second insulating layer 720 may include an inorganic insulating material, for example, such as silicon oxide, silicon nitride, silicon oxynitride, hafnium oxide, aluminum oxide, titanium oxide, tantalum oxide, and/or zinc oxide, or an organic insulating material, for example, such as polyacrylates resin, epoxy resin, phenolic resin, polyamides resin, polyimides resin, unsaturated polyesters resin, poly phenylenethers resin, polyphenylenesulfides resin, and/or benzocyclobutene (BCB). The second insulating layer 720 may include (e.g., may be made up of) a single layer or multiple layers of different materials stacked on one another.

The second conductive layer 300 is disposed on the second insulating layer 720. The second conductive layer 300 may include a capacitor electrode line 310, and an initialization voltage line 320 to supply the initialization voltage VINT (e.g., see FIG. 3).

Each of the capacitor electrode line 310 and the initialization voltage line 320 may extend in the first direction DR1. Each of the capacitor electrode line 310 and the initialization voltage line 320 may extend to a neighboring pixel (e.g., an adjacent pixel) PX in the first direction DR1 beyond the boundary of the corresponding pixel PX.

The capacitor electrode line 310 crosses the central portion of the pixel PX, and is disposed to overlap with the gate electrode 240 of the first transistor T1 thereunder, with the second insulating layer 720 interposed therebetween, so that the capacitor Cst is formed. The gate electrode 240 of the first transistor T1 may be the first electrode of the capacitor Cst, the expanded portion of the capacitor electrode line 310 overlapping with the gate electrode 240 may be the second electrode of the capacitor Cst, and the second insulating layer 720 interposed between the gate electrode 240 and the expanded portion of the capacitor electrode line 310 may be a dielectric of the capacitor Cst.

The width of the capacitor electrode line 310 may be expanded where it overlaps with the gate electrode 240 of the first transistor T1. The expanded portion of the capacitor electrode line 310 may include an opening overlapping with the gate electrode 240 of the first transistor T1 thereunder.

The initialization voltage line 320 may be located on the first side of the pixel PX in the second direction DR2 in a plan view (e.g., when viewed from the top). The initialization voltage line 320 may overlap with the fifth vertical portion 170 of the semiconductor layer 100.

The second conductive layer 300 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third insulating layer 730 covers the second conductive layer 300. The third insulating layer 730 may be generally disposed over the entire surface of the substrate SUB. The third insulating layer 730 may be an interlayer dielectric layer. The third insulating layer 730 may include the same or substantially the same material as that of the second insulating layer 720, or may include one or more materials selected from the materials described above for the second insulating layer 720.

The third conductive layer 400 is disposed on the third insulating layer 730. The third conductive layer 400 may include a plurality of data patterns 410 and 420, a first anode connection electrode 430 electrically connected between the anode electrode ANO of the light-emitting element LE and the semiconductor layer 100, a first supply voltage line 440 for supplying the first supply voltage ELVDD, and a data line 450 for transmitting the data signal DATA (e.g., see FIG. 3).

The third conductive layer 400 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 400 may include (e.g., may be made up of) a single layer or multiple layers. For example, the third conductive layer 400 may have a stack structure of Ti/Al/Ti, Mo/Al/Mo, Mo/AlGe/Mo, Ti/Cu, or the like.

The plurality of data patterns may include a first data pattern 410 and a second data pattern 420. The data patterns 410 and 420 may have a shape extending generally in the second direction DR2, and a length of each of the data patterns 410 and 420 in the second direction DR2 may be smaller than a length of the pixel PX in the second direction DR2. The data patterns 410 and 420 are physically spaced apart from each other. The data patterns 410 and 420 may be electrically connected with each other.

A portion of the first data pattern 410 may overlap with the gate electrode 240 of the first transistor T1. The portion of the first data pattern 410 may be electrically connected to the gate electrode 240 of the first transistor T1 through a first contact hole CNT1 penetrating through the third insulating layer 730 and the second insulating layer 720 to expose the gate electrode 240 of the first transistor T1. The first contact hole CNT1 may be located in the opening of the capacitor electrode line 310. The first data pattern 410 in the first contact hole CNT1 and the capacitor electrode line 310 adjacent thereto may be insulated from each other by the third insulating layer 730.

In addition, the first data pattern 410 may extend upward from the region where it overlaps with the gate electrode 240 of the first transistor T1 to insulate from and cross the first scan line 210, and may overlap with a part of the second horizontal portion 140 of the semiconductor layer 100. The first data pattern 410 may be electrically connected to the second horizontal portion 140 of the semiconductor layer 100 through a second contact hole CNT2 penetrating through the third insulating layer 730, the second insulating layer 720, and the first insulating layer 710 to expose a part of the second horizontal portion 140 of the semiconductor layer 100 at the region. A part of the second horizontal portion 140 may be, but is not limited to, a second region of the first subsidiary transistor T3_1.

In other words, the first data pattern 410 may electrically connect the gate electrode 240 of the first transistor T1 with the second horizontal portion 140 of the semiconductor layer 100.

The second data pattern 420 may overlap with the third connecting portion 183 of the semiconductor layer 100. The second data pattern 420 may be electrically connected to the third connecting portion 183 of the semiconductor layer 100 where it overlaps with it through a fourth contact hole CNT4 penetrating through the third insulating layer 730, the second insulating layer 720, and the first insulating layer 710 to expose the third connecting portion 183 of the semiconductor layer 100.

In addition, the second data pattern 420 may be extended upward from where the second data pattern 420 overlaps with the third connecting portion 183 of the semiconductor layer 100, may be insulated from and cross the second scan line 230, and may overlap with the initialization voltage line 320. The second data pattern 420 may be electrically connected to the initialization voltage line 320 through a fifth contact hole CNT5 penetrating through the third insulating layer 730 and exposing the initialization voltage line 320 where it overlaps with the initialization voltage line 320.

In other words, the second data pattern 420 may electrically connect the third connecting portion 183 of the semiconductor layer 100 with the initialization voltage line 320.

The first anode connection electrode 430 may have a shape extending generally in the second direction DR2, and a length of the first anode connection electrode 430 in the second direction DR2 may be smaller than the length of the pixel PX in the second direction DR2. The first anode connection electrode 430 is physically spaced apart from the plurality of data patterns 410 and 420. The first anode connection electrode 430 may connect the semiconductor layer 100 with the anode electrode ANO together with a second anode connection electrode 530, which will be described in more detail below.

The first anode connection electrode 430 may overlap with the lower part 122 of the second vertical portion 120 of the semiconductor layer 100. The first anode connection electrode 430 may be electrically connected to the lower part 122 of the second vertical portion 120 of the semiconductor layer 100 through a sixth contact hole CNT6 penetrating through the third insulating layer 730, the second insulating layer 720 and the first insulating layer 710 to expose the lower part 122 of the second vertical portion 120 of the semiconductor layer 100.

The first supply voltage line 440 may extend in the second direction DR2. The first supply voltage line 440 may extend to the neighboring pixel (e.g., the adjacent pixel) PX beyond the boundary of the pixel PX in the second direction DR2. The first supply voltage line 440 may be generally adjacent to the left side of the pixel PX, and may be disposed on the first side of the data line 450 in the first direction DR1, but the present disclosure is not limited thereto. The first supply voltage line 440 may be electrically connected to the capacitor electrode line 310 through an eighth contact hole CNT8 penetrating through the third insulating layer 730 and exposing the capacitor electrode line 310.

In addition, the first supply voltage line 440 may be electrically connected to the lower part 112 of the first vertical portion 110 of the semiconductor layer 100 through a seventh contact hole CNT7 penetrating through the third insulating layer 730, the second insulating layer 720, and the first insulating layer 710 to expose the lower part 112 of the first vertical portion 110.

The data line 450 may extend in the second direction DR2. The data line 450 may extend to the neighboring pixel PX beyond the boundary of the pixel PX in the second direction DR2. The data line 450 may be disposed to be adjacent to the second side of the pixel PX in the first direction DR1. The data line 450 may overlap with the first vertical portion 110 of the semiconductor layer 100.

The data line 450 may be electrically connected to the upper part 111 of the first vertical portion 110 of the semiconductor layer 100 through a third contact hole CNT3 penetrating through the third insulating layer 730, the second insulating layer 720, and the first insulating layer 710 to expose the upper part 111 of the first vertical portion 110 of the semiconductor layer 100. The third contact hole CNT3 may be located under (e.g., underneath) the second scan line 230 in a plan view (e.g., when viewed from the top), but the present disclosure is not limited thereto.

The protective film 740 may be formed on the third conductive layer 400. The protective film 740 may be formed of an inorganic layer, for example, such as a silicon nitride layer, a silicon oxynitride layer, a silicon oxide layer, a titanium oxide layer, or an aluminum oxide layer. However, the present disclosure is not limited thereto, and the protective film 740 may be omitted as needed or desired in some embodiments.

The protective film 740 is disposed on the first via layer VIA1. The first via layer VIA1 may be a planarization film. The first via layer VIA1 may include an inorganic insulating material or an organic insulating material, for example, such as polyacrylate resin, epoxy resin, phenolic resin, polyamide resin, polyimide resin, unsaturated polyesters resin, poly phenylen ether resin, poly phenylene sulfide resin, and/or benzocyclobutene (BCB).

The fourth conductive layer 500 is disposed on the first via layer VIA1. The fourth conductive layer 500 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The fourth conductive layer 500 may include the second anode connection electrode 530. A first anode contact hole ACNT1 penetrating through the first via layer VIA1 and the protective film 740 to expose the first anode connection electrode 430 may be formed in the first via layer VIA1. The second anode connection electrode 530 may be connected to the first anode connection electrode 430 through the first anode contact hole ACNT1.

A second via layer VIA2 is disposed on the fourth conductive layer 500. The second via layer VIA2 may be a planarization film. The second via layer VIA2 may include an inorganic insulating material or an organic insulating material, for example, such as polyacrylate resin, epoxy resin, phenolic resin, polyamide resin, polyimide resin, unsaturated polyesters resin, poly phenylen ether resin, poly phenylene sulfide resin, and/or benzocyclobutene (BCB).

The fifth conductive layer 600 is disposed on the second via layer VIA2. The fifth conductive layer 600 may include the anode electrode ANO. The anode electrode ANO may be disposed separately for each of the pixels PX. The anode electrode ANO may be electrically connected to the second anode connection electrode 530 through a second anode contact hole ACNT2 penetrating the second via layer VIA2 to expose the second anode connection electrode 530.

The anode electrode ANO may have, but is not limited to, a stack structure of a material layer having a high work function, for example, such as indium-tin-oxide (ITO), indium-zinc-oxide (IZO), zinc oxide (ZnO), and/or indium oxide ($In_2O_3$), and a reflective material layer, for example, such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a suitable mixture thereof. A layer having a higher work function may be disposed above a reflective material layer, so that such layer may be disposed to be closer to the light emitting layer EL. The anode electrode ANO may have, but is not limited to, a multilayered structure of ITO/Mg, ITO/MgF, ITO/Ag, or ITO/Ag/ITO.

A pixel-defining layer PDL may be disposed on the fifth conductive layer 600. The pixel-defining layer PDL may include an opening exposing a part of the anode electrode ANO. The pixel-defining layer PDL may include an organic insulating material or an inorganic insulating material. For example, the pixel-defining layer PDL may include at least one of a polyimide resin, an acrylic resin, a silicon compound, a polyacrylic resin, and/or the like.

The light emitting layer EL may be disposed on the anode electrode ANO exposed by the pixel-defining layer PDL. The light emitting layer EL may include an organic material layer. The organic material layer of the light emitting layer EL may include an organic emission layer, and may further include a hole injecting/transporting layer and/or an electron injecting/transporting layer.

The cathode electrode CAT may be disposed on the light emitting layer EL. The cathode electrode CAT may be a common electrode disposed across the pixels PX. The anode electrode ANO, the light emitting layer EL, and the cathode electrode CAT may form a light-emitting element LE.

The cathode electrode CAT may include a material layer having a small work function, for example, such as Li, Ca, LiF/Ca, LiF/AI, Al, Mg, Ag, Pt, Pd, Ni, Au, Nd, Ir, Cr, BaF, and/or Ba, or a suitable compound or mixture thereof (e.g., a mixture of Ag and Mg). The cathode electrode CAT may further include a transparent metal oxide layer disposed on the material layer having the small work function.

A thin-film encapsulation layer 770 including a first inorganic encapsulation film 771, a first organic encapsulation film 772, and a second inorganic encapsulation film 773 is disposed on the cathode electrode CAT. The first inorganic encapsulation film 771 and the second inorganic encapsulation film 773 may be in contact with each other at an end of the thin-film encapsulation layer 770. The first organic encapsulation film 772 may be encapsulated by the first inorganic encapsulation film 771 and the second inorganic encapsulation film 773.

Each of the first inorganic encapsulation film 771 and the second inorganic encapsulation film 773 may include silicon nitride, silicon oxide, or silicon oxynitride. The first organic encapsulation film 772 may include an organic insulating material.

Figure 12:
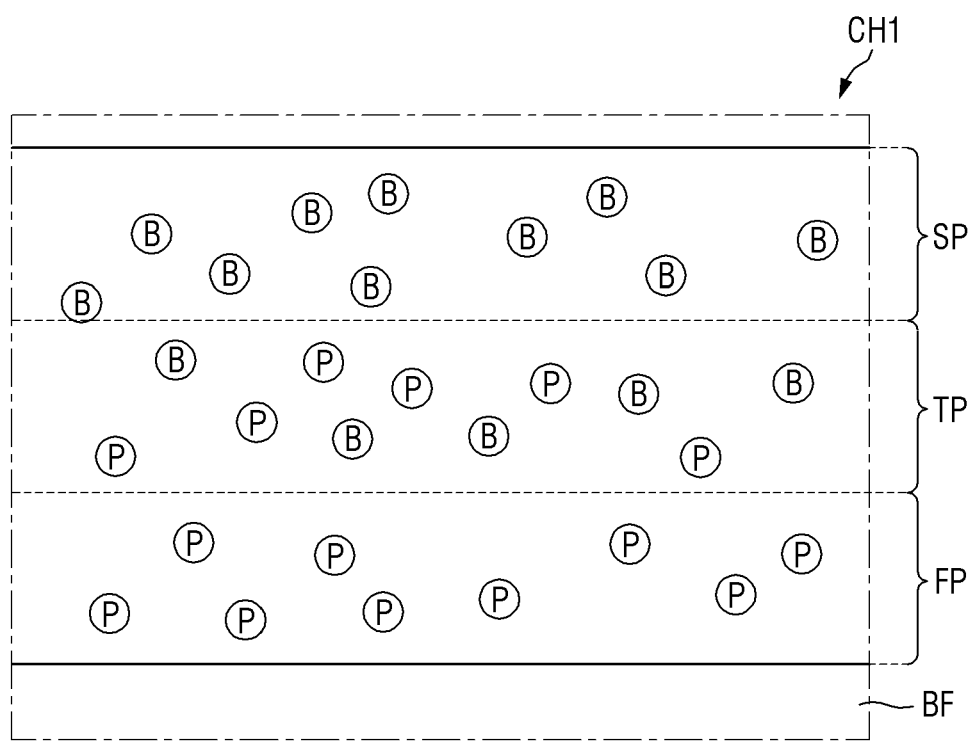
FIGS. 12-13 are cross-sectional views schematically illustrating a channel of a first transistor of a display device according to another embodiment.
Figure 12:
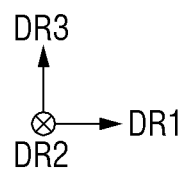
Figure 13:
Figure 13:
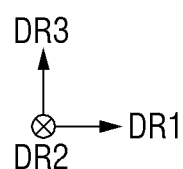

FIGS. 12 and 13 are cross-sectional views schematically illustrating a channel of a first transistor of a display device according to another embodiment.

The embodiment of FIGS. 12 and 13 may be different from the embodiment of FIG. 9, in that in FIGS. 12 and 13, a third region TP in which boron (B) and phosphorus (P) are mixed with each other may be further formed between a first region FP and a second region SP of a channel CH1. Accordingly, the differences between the embodiments of FIGS. 9 and 12-13 may be mainly described, and redundant description therebetween may not be repeated.

The channel CH1 of the first transistor T1 may include a first region FP containing phosphorus (P), a second region SP containing boron (B), and a third region TP containing phosphorus (P) and boron (B).

The first region FP may form a bottom of the channel CH1, and may be disposed to be adjacent to or in contact with the buffer layer BF. The first region FP may contain phosphorus (P). By disposing the first region FP containing phosphorus (P) at the bottom of the channel CH1, and the second region SP containing boron (B) at a top of the channel CH1, it may be possible to reduce defects in the channel CH1 to improve issues related to image retention.

The second region SP may form the top of the channel CH1, and may be disposed above the first region FP. The second region SP may be disposed farther from the buffer layer BF than the first region FP, and may be disposed to be adjacent to the gate electrode of the first transistor T1. The second region SP may include boron (B). By disposing the second region SP containing boron (B) at the top of the channel CH1, it may be possible to reduce defects of the channel CH1 to thereby improve image retention.

The third region TP may form a middle of the channel CH1, and may be disposed between the first region FP and the second region SP. The third region TP may contain boron (B) and phosphorus (P). Boron (B) and phosphorus (P) may have a suitable concentration distribution (e.g., a certain or predetermined concentration distribution) in the third region TP. In an embodiment, the content of boron (B) in the third region TP may be gradually decreased toward the first region FP. However, the present disclosure is not limited thereto. For example, boron (B) and phosphorus (P) may be randomly distributed in the third region TP.

The third region TP may have a suitable thickness (e.g., a predetermined thickness). The thickness of the third region TP may be greater than the thickness of the first region FP, and smaller than the thickness of the second region SP. However, the present disclosure is not limited thereto. The thickness of the third region TP may be equal to those of each of the first region FP and the second region SP, or may be greater than or equal to the thickness of the first region FP or the second region SP.

According to the present embodiment, boron (B) may be located at a location adjacent to the surface (e.g., the top surface) of the channel CH1 where electrons and holes move or substantially move in the channel CH1 of the first transistor T1. When phosphorus (P) is located at the surface (e.g., the top surface) of the channel CH1, the channel CH1 may act as a defect. Therefore, by disposing boron (B) at the surface (e.g., the top surface) of the channel CH1 and separating the phosphorus (P) from the surface, it may be possible to further improve issues relating to image retention in the display device.

Hereinafter, a method of fabricating a display device will be described in more detail with reference to other drawings.

FIGS. 14 to 25 are views showing processing steps of a method of fabricating a display device according to an embodiment of the present disclosure. FIGS. 14 to 25 show a method of fabricating a part of the display device shown in FIG. 6.

Figure 14:
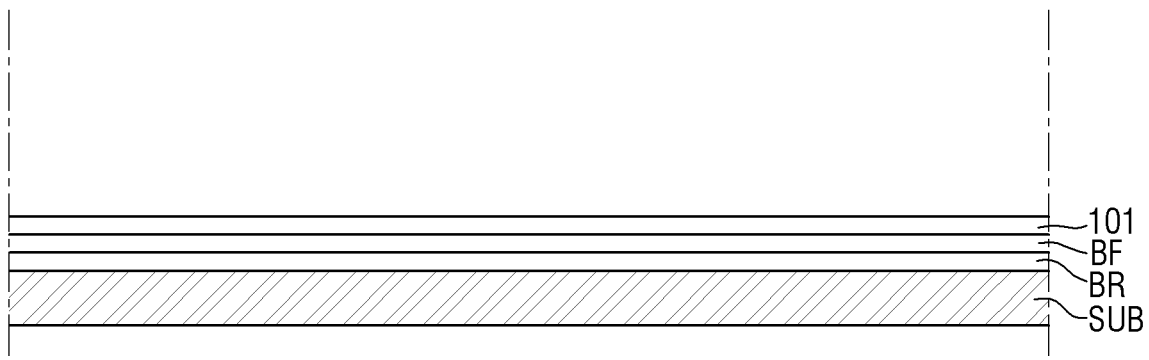
FIGS. 14-25 are views showing processing steps of a method of fabricating a display device according to an embodiment of the present disclosure.

Referring first to FIG. 14, a barrier layer BR is formed on a substrate SUB, a buffer layer BF is formed on the barrier layer BR, and a first amorphous silicon layer 101 is formed on the buffer layer BF.

The barrier layer BR may be formed by depositing a suitable material layer for the barrier layer entirely on the substrate SUB. Similarly, the buffer layer BF may be formed by depositing a suitable material layer for the buffer layer on the barrier layer BR. The first amorphous silicon layer 101 may be formed by low-pressure chemical vapor deposition (LPCVD), atmospheric pressure chemical vapor deposition (APCVD), plasma enhanced chemical vapor deposition (PECVD), sputtering, vacuum deposition, and/or the like.

Figure 15:
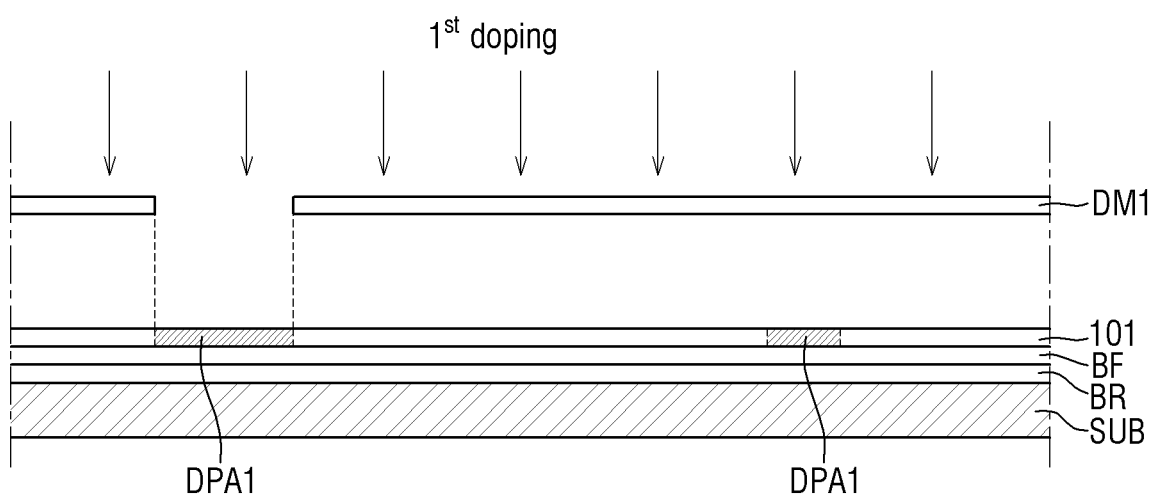

Next, referring to FIG. 15, a first doped area DPA1 is formed by doping the first amorphous silicon layer 101 with impurities. In more detail, a first mask DM1 may be aligned above the first amorphous silicon layer 101. The first mask DM1 may expose a region corresponding to the first doped area DPA1, and may cover other regions.

Subsequently, a first impurity is doped into the first amorphous silicon layer 101 using the first mask DM1. The first impurity may be Group V element, for example, such as phosphorus (P). Even though the first impurity is disposed onto (e.g., is implanted into) the entire surface of the first mask DM1, the first impurity may be implanted and doped in only parts of the first amorphous silicon layer 101 that is exposed by the first mask DM1. As a result, first doped areas DPA1 that are doped with the first impurity may be formed in the first amorphous silicon layer 101.

The first impurity may be doped by ion implantation. When the ion implantation is used, the first impurity in an ion state may be implanted into the first amorphous silicon layer 101 at an acceleration voltage of 10 keV to 40 keV. According to an embodiment of the present disclosure, the dose of the first impurity may be $1.0E11$ $cm^{-2}$ to $1.0E13$ $cm^{-2}$. Phosphorus (P) may be easily formed at the bottom of the channel when the dose of the first impurity is $1.0E11$ $cm^{-2}$ or more. It may be possible to prevent or substantially prevent the threshold voltage Vth of the channel from shifting in the negative direction when the dose of the first impurity is $1.0E13$ $cm^{-2}$ or less.

Figure 16:
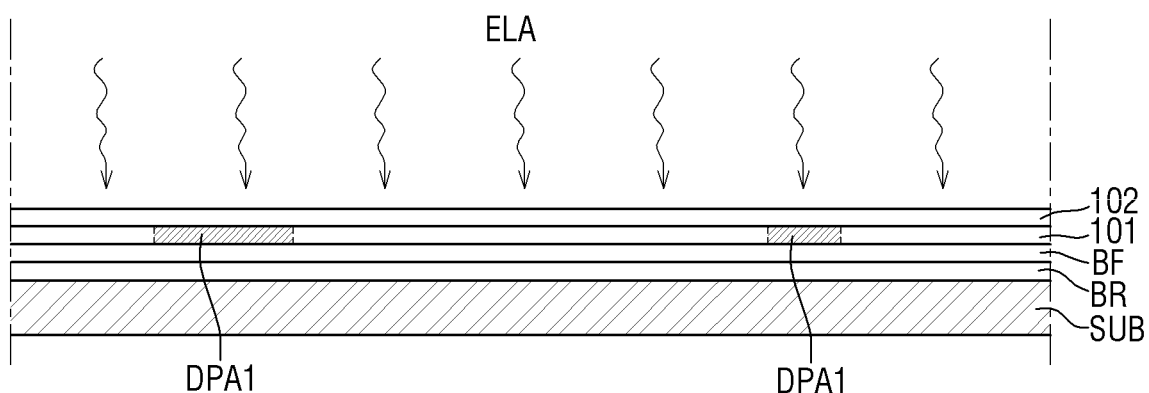
Figure 17:
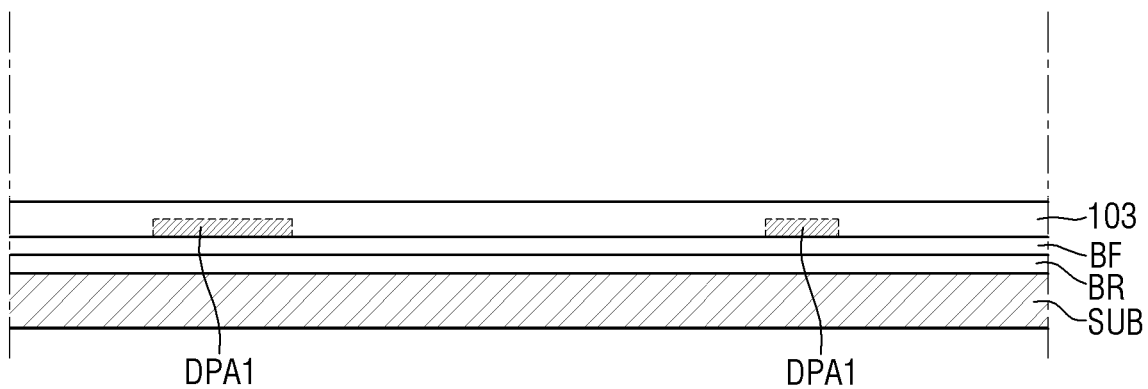

Referring to FIGS. 16 and 17, a second amorphous silicon layer 102 is subsequently formed on the first amorphous silicon layer 101. The second amorphous silicon layer 102 may be formed entirely on the first amorphous silicon layer 101. In addition, the second amorphous silicon layer 102, similar to the first amorphous silicon layer 101, may be formed by low-pressure chemical vapor deposition (LPCVD), atmospheric pressure chemical vapor deposition (APCVD), plasma enhanced chemical vapor deposition (PECVD), sputtering, vacuum deposition, and/or the like.

A polycrystalline silicon layer 103 is formed by crystallizing the first amorphous silicon layer 101 and the second amorphous silicon layer 102.

In more detail, the polycrystalline silicon layer 103 may be formed by irradiating a laser beam onto the first amorphous silicon layer 101 and the second amorphous silicon layer 102. A laser may intermittently generate the laser beam to irradiate the first amorphous silicon layer 101 and the second amorphous silicon layer 102. For example, the laser may include (e.g., may be) an excimer laser source that generates a short wavelength, high power, and high efficiency laser beam. The source of the excimer laser may include, for example, an inert gas, an inert gas halide, a mercury halide, an inert gas acid compound, and/or a polyatomic excimer. The inert gas may include (e.g., may be) Ar2, Kr2, Xe2, and/or the like. The inert gas halide may include (e.g., may be) ArF, ArCl, KrF, KrCl, XeF, XeCl, and/or the like. The mercury halide may include (e.g., may be) HgCl, HgBr, HgI, and/or the like. The inert gas oxide may include (e.g., may be) ArO, KrO, XeO, and/or the like. The polyatomic excimer may include (e.g., may be) Kr2F, Xe2F, and/or the like.

The laser beam is irradiated to the first amorphous silicon layer 101 and the second amorphous silicon layer 102 while being moved (e.g., while being scanned) over the substrate SUB in a suitable direction, and the first amorphous silicon layer 101 and the second amorphous silicon layer 102 may be crystallized into the polycrystalline silicon layer 103. The laser may irradiate a laser beam having an energy density of approximately 450 $mJ/cm^2$ to approximately 500 $mJ/cm^2$. According to an embodiment of the present disclosure, the width of the laser beam may be approximately 480 μm, and a scan pitch of the laser beam may be approximately 9 μm to approximately 30 μm. For example, when the scan pitch is approximately 24 μm, the laser beam may be irradiated approximately 24 times. As shown in FIG. 17, the first amorphous silicon layer 101 and the second amorphous silicon layer 102 may be converted into the polycrystalline silicon layer 103 via the crystallization process using the laser beam.

Figure 18:
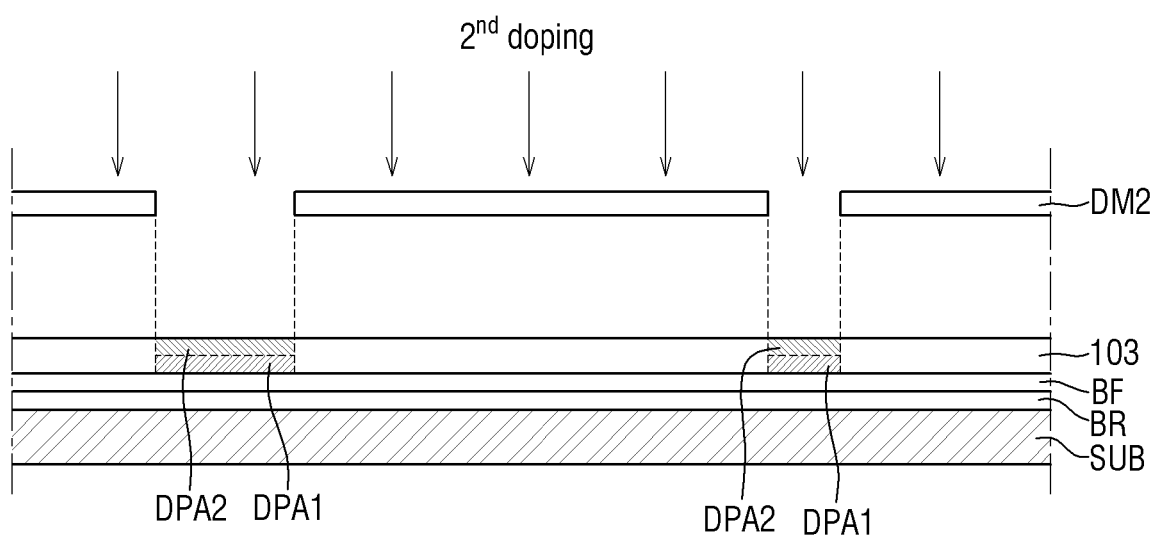
Figure 19:
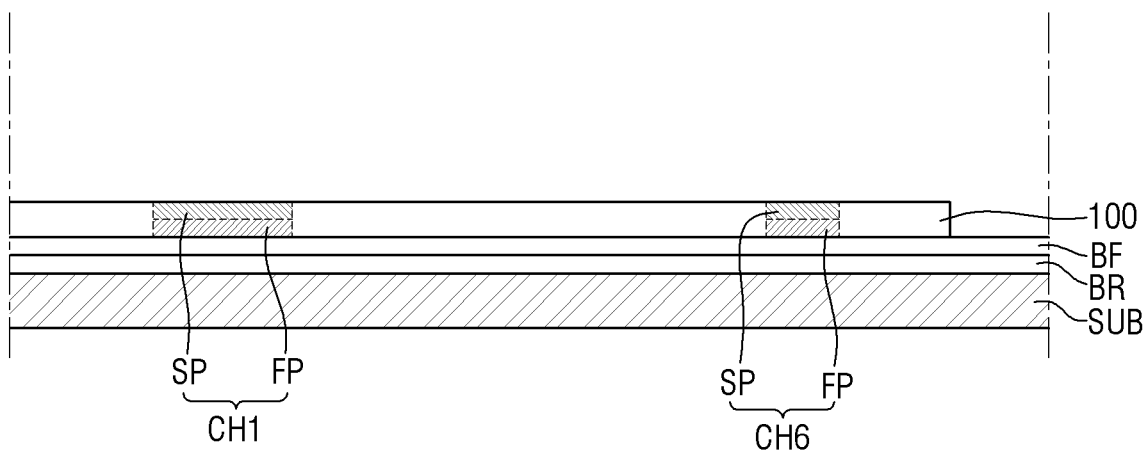

Referring to FIGS. 18 and 19, a second doped area DPA2 is formed by doping a second impurity onto the polycrystalline silicon layer 103. In more detail, a second mask DM2 may be aligned above the polycrystalline silicon layer 103. The second mask DM2 may expose a region corresponding to the first doped area DPA1, and may cover other regions.

Subsequently, a second impurity is doped into the polycrystalline silicon layer 103 from above the second mask DM2. The second impurity may be Group III element, for example, such as boron (B). Even though the second impurity is disposed onto (e.g., is implanted into) the entire surface of the second mask DM2, the second impurity may be implanted and doped in only parts of the polycrystalline silicon layer 103 that is exposed by the second mask DM2. As a result, second doped areas DPA2 doped with the second impurity may be formed in the polycrystalline silicon layer 103. The second doped area DPA2 may be formed on the first doped area DPA1 to overlap with each other.

The second impurity may be doped by ion implantation. When the ion implantation is used, the second impurity in an ion state may be implanted into the polycrystalline silicon layer 103 at an acceleration voltage of 0.1 keV to 5 keV. According to an embodiment of the present disclosure, the dose of the second impurity may be $1.0E11$ $cm^{-2}$ to $1.0E13$ $cm^{-2}$. Boron (B) may be easily doped into the channel when the dose of the second impurity is $1.0E11$ $cm^{-2}$ or more. It may be possible to prevent or substantially prevent the threshold voltage Vth of the channel from shifting in the positive direction when the dose of the second impurity is $1.0E13$ $cm^{-2}$ or less.

As a result, the second doped areas DPA2 that are doped with the second impurity may be formed on the first doped areas DPA1 of the polycrystalline silicon layer 103. In addition, as shown in FIG. 19, the first doped areas DPA1 of the polycrystalline silicon layer 103 may be formed as the first region FP of the channels CH1 and CH6, and the second doped areas DPA2 disposed on the first doped areas DPA1 may be formed as the region SP of the channels CH1 and CH6.

The polycrystalline silicon layer 103 is cleaned using hydrogen fluoride (HF) or a buffered oxide etchant (BOE). The polycrystalline silicon layer 103 may be cleaned via a cleaning process to remove a native oxide film formed thereon.

Figure 20:
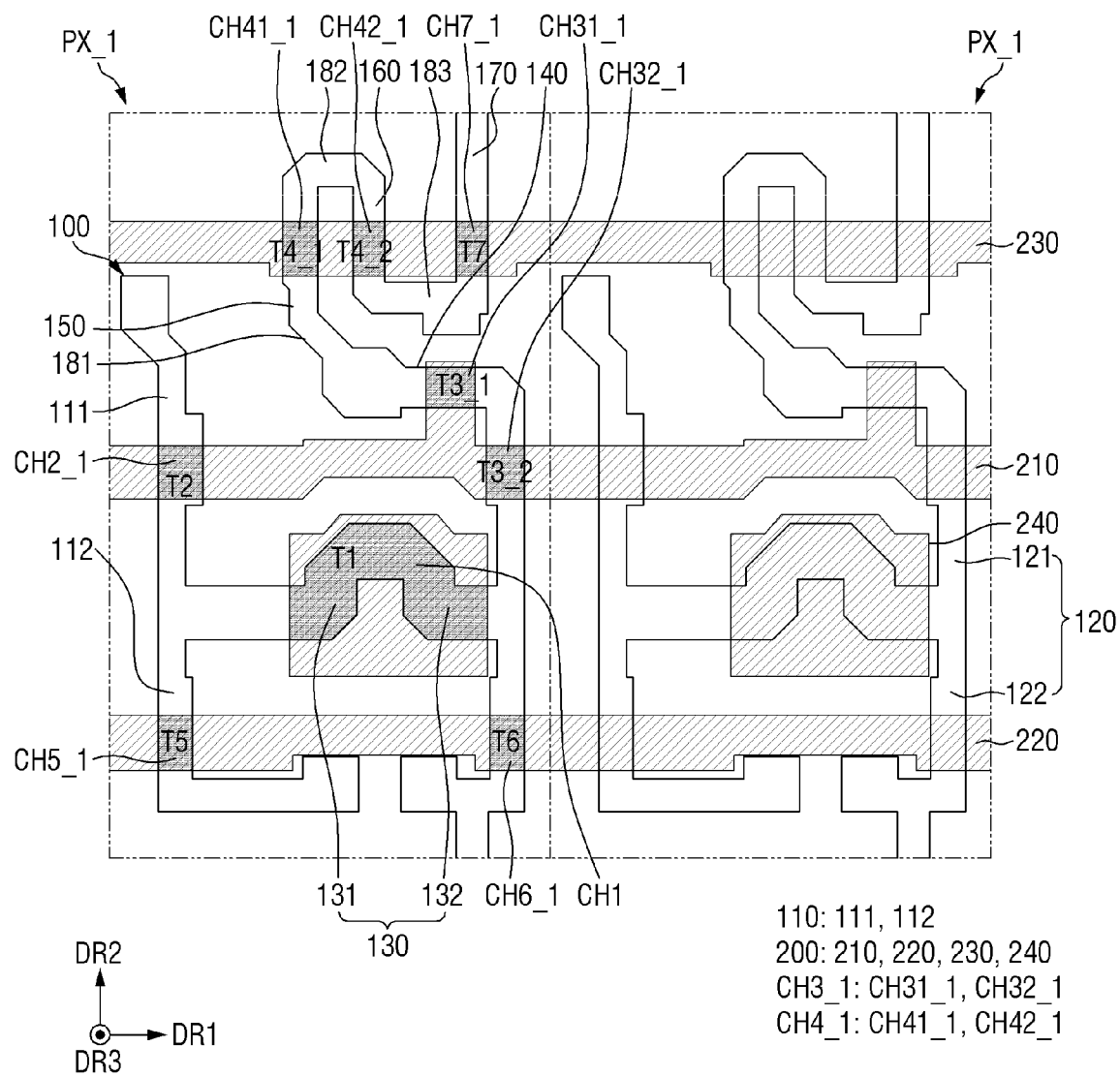

Referring to FIG. 20 in conjunction with FIG. 19, the polycrystalline silicon layer 103 is patterned to form a semiconductor layer 100. According to the present embodiment, the channel CH1 of the first transistor T1, which is the driving transistor, may include a first region FP containing Group V element as the first impurity, and a second region SP containing Group III element as the second impurity. In addition, the channels CH2_1, CH3_1 (CH31 and CH32), CH4_1 (CH41 and CH42), CH5_1, CH6_1, and CH7_1 of the second to seventh transistors T2, T3, T4, T5, T6, and T7, which are switching transistors, may include the first region FP containing Group V element as the first impurity and the second region SP containing Group III element as the second impurity.

Figure 21:
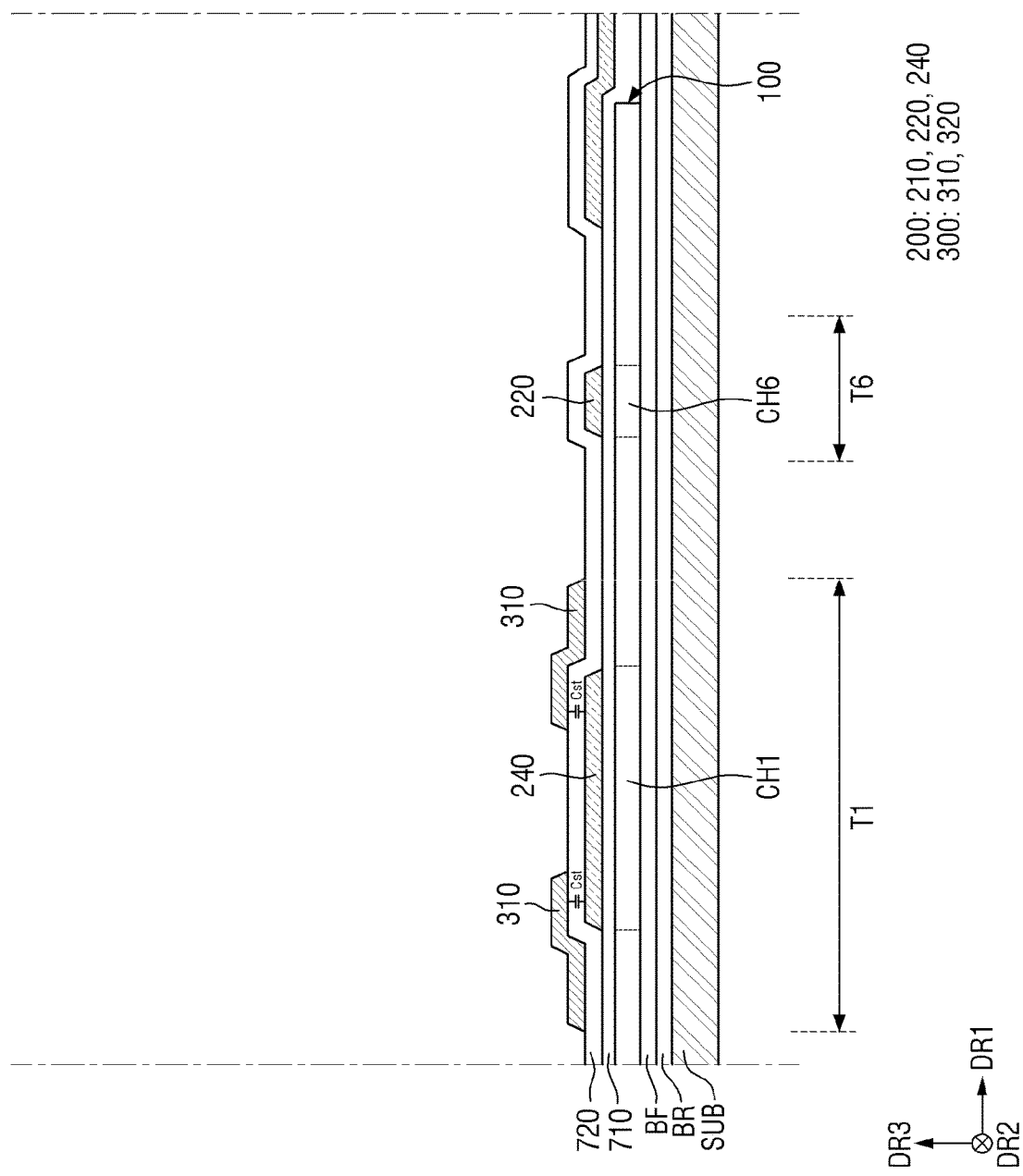

Subsequently, referring to FIG. 21, a first insulating layer 710 is formed on the semiconductor layer 100. The first insulating layer 710 may be formed by depositing a suitable material layer for the first insulating layer on the substrate SUB. Subsequently, an emission control line 220 and a gate electrode 240 as a first conductive layer are formed on the first insulating layer 710. The first conductive layer may be formed via a mask process. In more detail, a material layer for the first conductive layer may be deposited entirely on the substrate SUB, and then may be patterned via a photolithography process, to form the emission control line 220 and the gate electrode 240 as shown in FIG. 21.

Subsequently, a second insulating layer 720 is formed on the first insulating layer 710 on which the first conductive layer is formed, and a capacitor electrode line 310, which is a second conductive layer, is formed on the second insulating layer 720. The second insulating layer 720 may be formed by depositing a suitable material layer for the second insulating layer on the substrate SUB. In addition, the second conductive layer may be formed via a mask process to form the capacitor electrode line 310.

Figure 22:
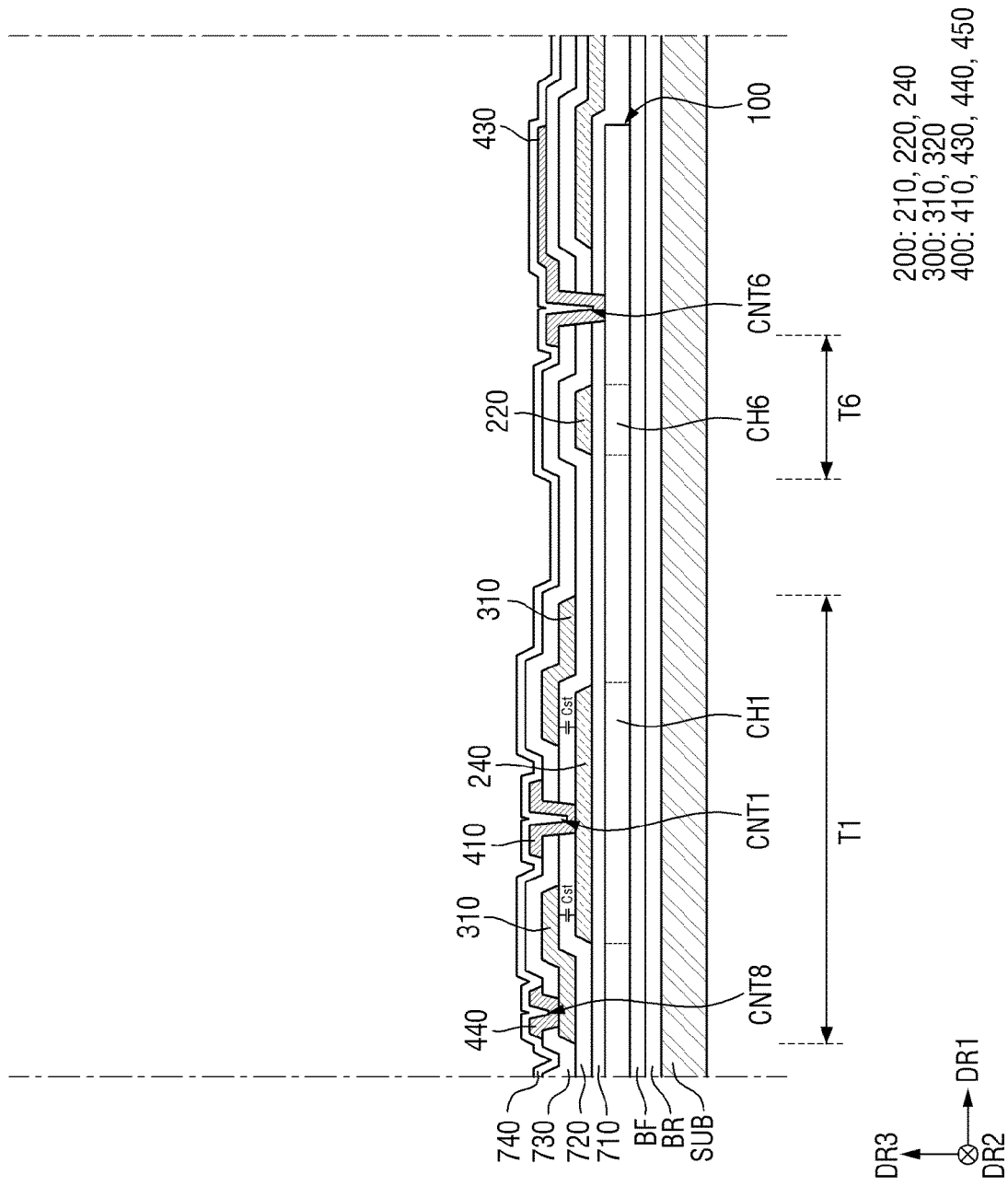

Subsequently, referring to FIG. 22, a third insulating layer 730 is formed on the second insulating layer 720 on which the second conductive layer is formed, and a data pattern 410, a first anode connection electrode 430, and a first supply voltage line 440, which are the third conductive layer, are formed on the third insulating layer 730. The third insulating layer 730 may be formed by depositing a suitable material layer for the third insulating layer on the substrate SUB. In addition, the third conductive layer may be formed via a mask process to form the data pattern 410, the first anode connection electrode 430, and the first supply voltage line 440. The data pattern 410 may be connected to a gate electrode 240 through a first contact hole CNT1 penetrating the second insulating layer 720 and the third insulating layer 730. The first anode connection electrode 430 may be connected to the semiconductor layer 100 of the sixth transistor T6 through a sixth contact hole CNT6 penetrating the first insulating layer 710, the second insulating layer 720, and the third insulating layer 730. In addition, the first supply voltage line 440 may be connected to the capacitor electrode line 310 through an eighth contact hole CNT8 penetrating through the third insulating layer 730. Subsequently, a protective film 740 is formed on the third insulating layer 730 on which the third conductive layer is formed.

Figure 23:
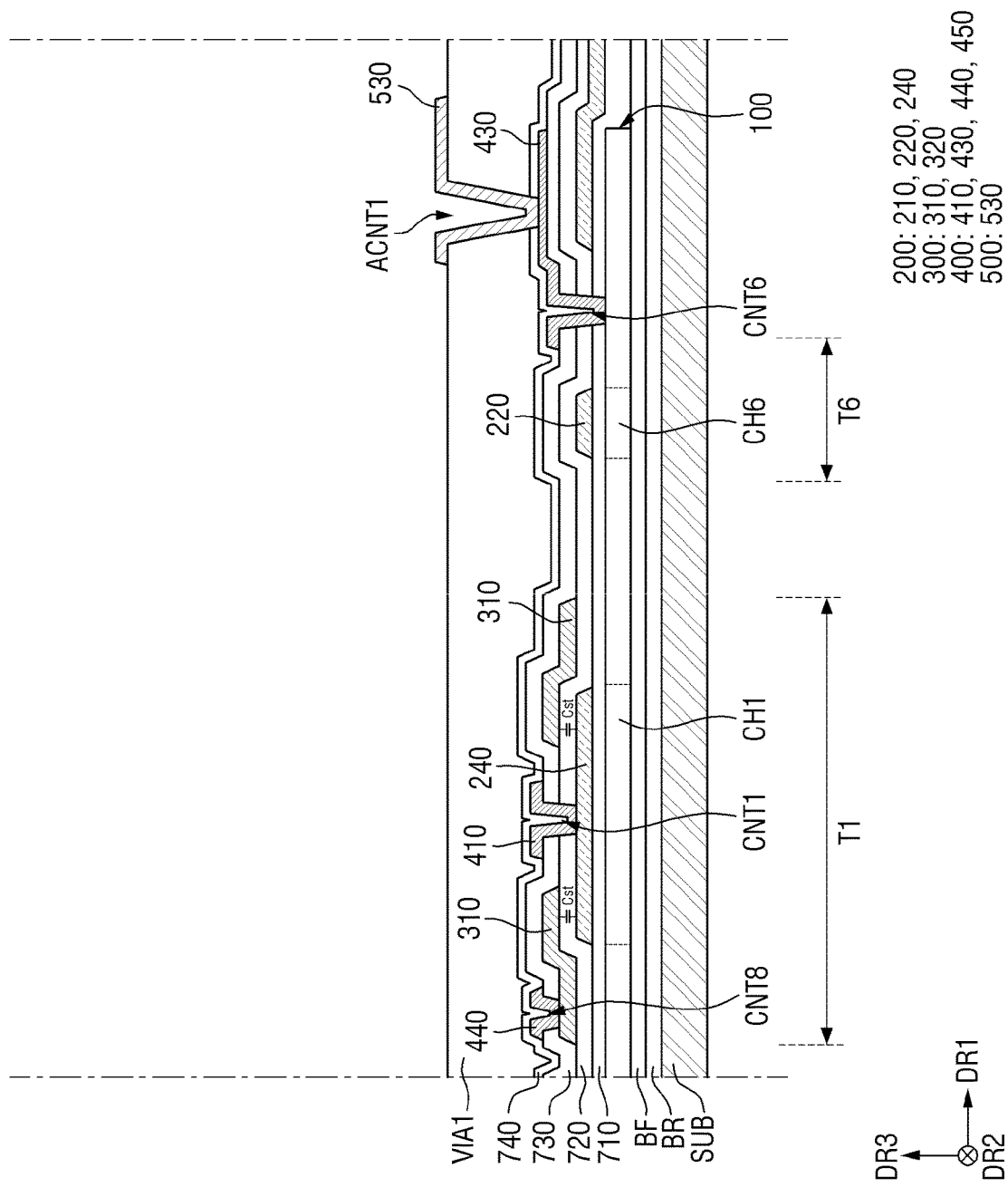

Subsequently, referring to FIG. 23, a first via layer VIA1 is formed on the protective film 740 formed on the substrate SUB, and a second anode connection electrode 530 that is the fourth conductive layer is formed on the first via layer VIA1. The first via layer VIA1 may include an inorganic insulating material including a photosensitive material or an organic material. For the organic material, an organic material layer may be applied and then exposure and development may be carried out. The fourth conductive layer may be formed via a mask process to form the second anode connection electrode 530. The second anode connection electrode 530 may be connected to the first anode connection electrode 430 through the first anode contact hole ACNT1 penetrating the first via layer VIA1.

Figure 24:
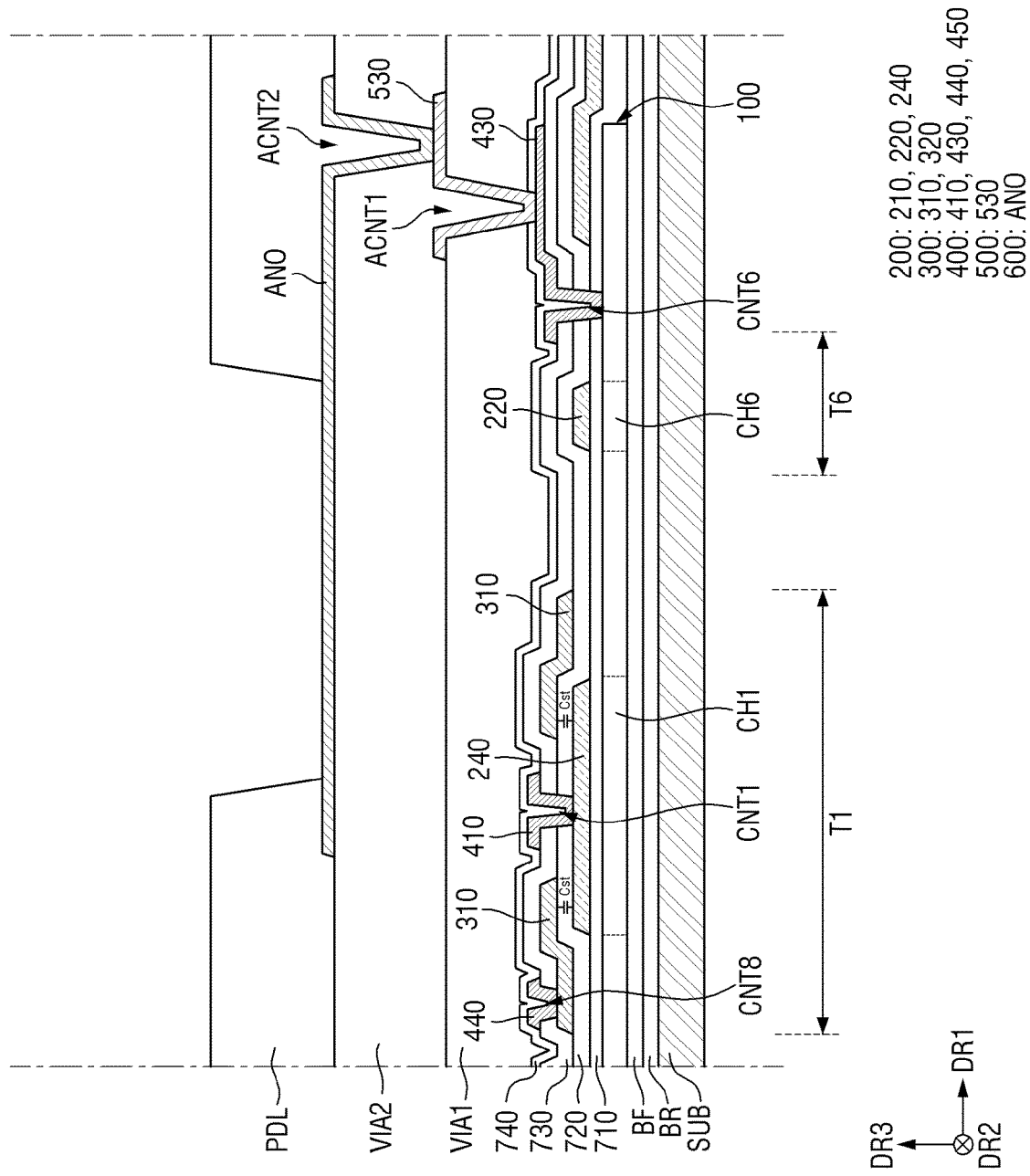

Subsequently, referring to FIG. 24, a second via layer VIA2 is formed on the fourth conductive layer formed on the substrate SUB, and an anode electrode ANO that is the fifth conductive layer is formed on the second via layer VIA2. The second via layer VIA2 may be formed via the same or substantially the same process as that of the first via layer VIA1. The fifth conductive layer may be formed via a mask process to form the anode electrode ANO. The anode electrode ANO may be connected to the second anode connection electrode 530 through the second anode contact hole ACNT2 penetrating the second via layer VIA2.

Subsequently, a pixel-defining film PDL is formed on the fifth conductive layer formed on the substrate SUB. When the pixel-defining film PDL is made of an organic material, the pixel-defining film PDL may be formed by applying an organic material layer and then performing exposure and development. The pixel-defining film PDL may expose a part of the anode electrode ANO.

Figure 25:
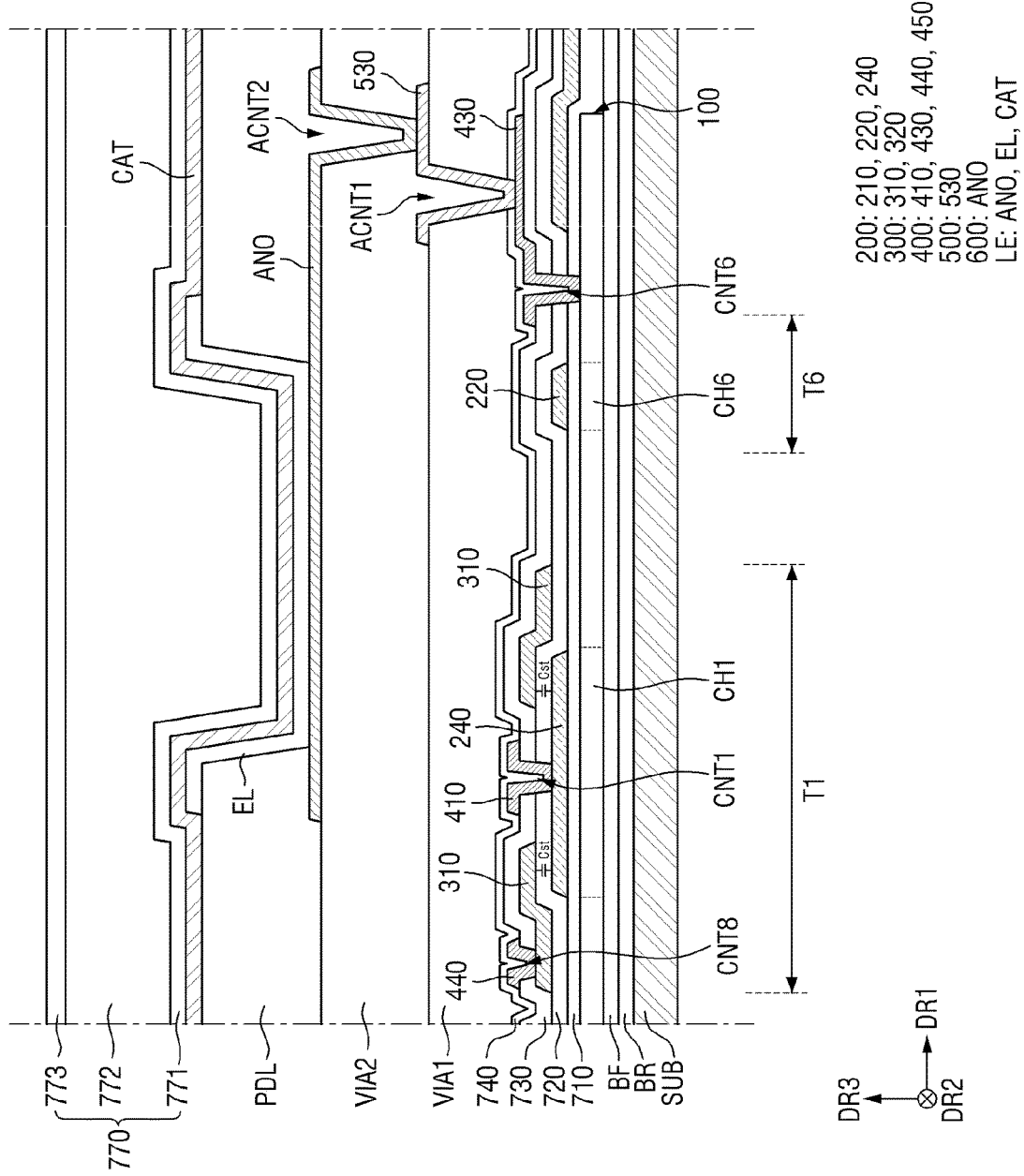

Subsequently, referring to FIG. 25, a light emitting layer EL is formed on the anode electrode ANO exposed by the pixel-defining film PDL, and a cathode electrode CAT is formed on the light emitting layer EL. The light emitting layer EL may be coated by deposition or inkjet printing. The cathode electrode CAT may be formed in the display area by deposition using a mask.

Subsequently, a first inorganic encapsulation film 771, a first organic encapsulation film 772, and a second inorganic encapsulation film 773 are sequentially formed on the cathode electrode CAT formed on the substrate SUB, to form a thin-film encapsulation layer 770. In this manner, a display device is fabricated.

Figure 26:
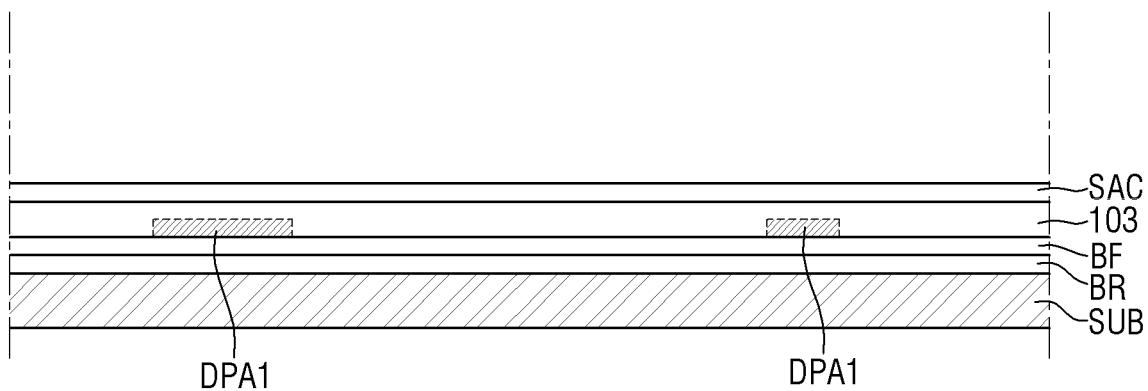
FIGS. 26 to 28 are views showing processing steps of a method of fabricating a display device according to another embodiment of the present disclosure.
Figure 27:
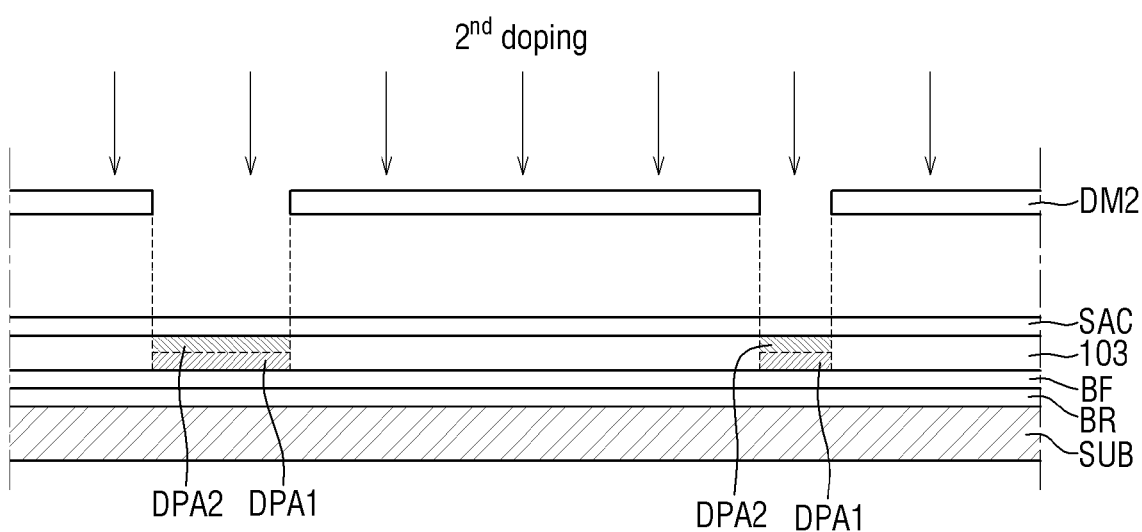
Figure 28:
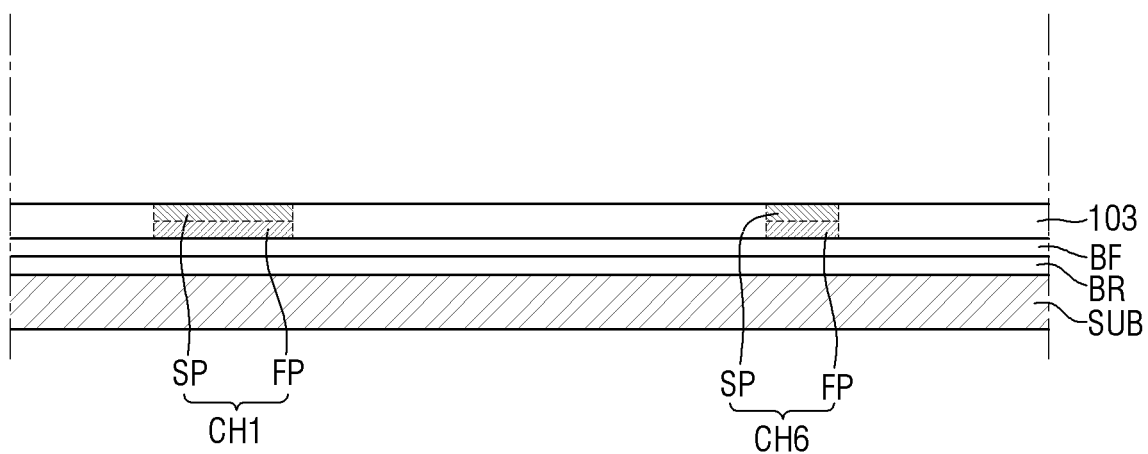

FIGS. 26 to 28 are views showing processing steps of a method of fabricating a display device according to another embodiment of the present disclosure.

The embodiment of FIGS. 26 to 28 may be different from the above-described embodiments with reference to FIGS. 14 to 25, in that in FIGS. 26 to 28, a sacrificial layer SAC may be further formed before the doping of the second impurity. Accordingly, the differences therebetween may be mainly described in more detail hereinafter, and redundant description may not be repeated.

Referring to FIG. 26, after the polycrystalline silicon layer 103 is formed as shown in FIG. 17, the sacrificial layer SAC may be formed on the polycrystalline silicon layer 103. The sacrificial layer SAC may be formed by depositing a suitable material layer for the sacrificial layer on the entire surface of the substrate SUB. The sacrificial layer SAC may include (e.g., may be made of) silicon oxide or silicon nitride.

Subsequently, referring to FIG. 27, a second doped area DPA2 is formed by doping a second impurity onto the polycrystalline silicon layer 103. The sacrificial layer SAC may reduce an impact damage of ion implantation during the doping of the second impurity, and may relatively lower the acceleration voltage. Accordingly, it may be possible to reduce a damage that may be applied to the polycrystalline silicon layer 103 by the second impurity doping. This process is the same or substantially the same as that described above with reference to FIG. 18, and thus, redundant description thereof will not be repeated.

Subsequently, referring to FIG. 28, after the second impurity doping process is completed, the sacrificial layer SAC that is disposed on the polycrystalline silicon layer 103 is removed by etching. Thereafter, the processes described above with reference to FIGS. 19 to 25 are carried out to fabricate a display device.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
    a substrate;
    a semiconductor layer on the substrate, and comprising a channel of at least one transistor;
    a first insulating layer on the semiconductor layer; and
    a gate electrode on the first insulating layer,
    wherein the semiconductor layer comprises polycrystalline silicon,
    wherein the channel comprises:
        a first region containing a first impurity; and
        a second region containing a second impurity different from the first impurity, and
    wherein the second region is located on the first region, and overlaps the first region.

2. The display device of claim 1, wherein an upper surface of the first region is in contact with a lower surface of the second region.

3. The display device of claim 1, wherein the first impurity contains a Group V element, and the second impurity contains a Group III element.

4. The display device of claim 3, wherein the first impurity comprises phosphorus, and the second impurity comprises boron.

5. The display device of claim 1, wherein a thickness of the first region ranges from 100 Å to 400 Å, and a thickness of the second region ranges from 70 Å to 370 Å.

6. A display device comprising:
    a substrate;
    a semiconductor layer on the substrate, and comprising a channel of at least one transistor;
    a first insulating layer on the semiconductor layer; and
    a gate electrode on the first insulating layer,
    wherein the semiconductor layer comprises polycrystalline silicon,
    wherein the channel comprises:
        a first region containing a first impurity; and
        a second region containing a second impurity different from the first impurity, and
    wherein the display device further comprises a third region between the first region and the second region, the third region containing the first impurity and the second impurity.

7. The display device of claim 6, wherein the second impurity in the third region has a concentration gradient that gradually decreases toward the first region.

8. The display device of claim 1, wherein the at least one transistor further comprises a first electrode and a second electrode connected to the semiconductor layer.

9. The display device of claim 8, further comprising a light-emitting element on the at least one transistor, the light-emitting element comprising:
    an anode electrode electrically connected to the second electrode;
    a light emitting layer on the anode electrode; and
    a cathode electrode on the light emitting layer.

10. A method of fabricating a display device, comprising:
    forming a first amorphous silicon layer on a substrate;
    forming a first region by doping at least a part of the first amorphous silicon layer with a first impurity;
    forming a second amorphous silicon layer on the first amorphous silicon layer;
    forming a polycrystalline silicon layer by crystallizing the first amorphous silicon layer and the second amorphous silicon layer;
    forming a second region on the first region of the polycrystalline silicon layer by doping the polycrystalline silicon layer with a second impurity different from the first impurity; and
    forming a semiconductor layer by patterning the polycrystalline silicon layer.

11. The method of claim 10, wherein the doping of the part of the first amorphous silicon layer with the first impurity comprises doping the first impurity with an acceleration voltage of 10 keV to 40 keV.

12. The method of claim 10, wherein the doping of the first impurity comprises doping the first impurity at a dose of $1.0E11$ cm$^{-2}$ to $1.0E13$ cm$^{-2}$.

13. The method of claim 10, wherein the first amorphous silicon layer is formed to have a thickness of 100 Å to 400 Å.

14. The method of claim 10, wherein the doping of the polycrystalline silicon layer with the second impurity comprises doping the second impurity with an acceleration voltage of 0.1 keV to 5 keV.

15. The method of claim 10, wherein the doping of the second impurity comprises doping the second impurity at a dose of $1.0E11$ cm$^{-2}$ to $1.0E13$ cm$^{-2}$.

16. The method of claim 10, wherein the second amorphous silicon layer is formed to have a thickness of 70 Å to 370 Å.

17. The method of claim 10, wherein the first impurity comprises phosphorus, and the second impurity comprises boron.

18. The method of claim 10, wherein the first region and the second region overlap with each other, and an upper surface of the first region and a lower surface of the second region are in contact with each other.

19. The method of claim 10, further comprising:
   forming a sacrificial layer on the polycrystalline silicon layer between the forming of the polycrystalline silicon layer and the forming of the second region by the doping of the second impurity; and
   removing the sacrificial layer before the forming of the semiconductor layer.

* * * * *